(12) United States Patent
Olsson et al.

(10) Patent No.: US 7,842,926 B2
(45) Date of Patent: Nov. 30, 2010

(54) METHOD AND DEVICE FOR CORRECTING SLM STAMP IMAGE IMPERFECTIONS

(75) Inventors: Martin Olsson, Linkoping (SE); Torbjörn Sandström, Pixbo (SE); Mats Rosling, Täby (SE)

(73) Assignee: Micronic Laser Systems AB, Taby (SE)

( * ) Notice: Subject to any disclaimer, the term of this patent is extended or adjusted under 35 U.S.C. 154(b) by 405 days.

(21) Appl. No.: 12/026,438

(22) Filed: Feb. 5, 2008

(65) Prior Publication Data
US 2008/0127031 A1    May 29, 2008

Related U.S. Application Data

(63) Continuation of application No. 10/987,589, filed on Nov. 12, 2004, now Pat. No. 7,328,425.

(60) Provisional application No. 60/519,495, filed on Nov. 12, 2003.

(51) Int. Cl.
G06F 17/50 (2006.01)
G06F 19/00 (2006.01)
G02F 1/11 (2006.01)
G01T 1/24 (2006.01)
G05B 21/02 (2006.01)

(52) U.S. Cl. .............. 250/370.08; 250/370.1; 716/21; 359/291

(58) Field of Classification Search .......... 716/21; 250/370.08, 370.1, 370.01; 359/290–291, 359/281, 285; 700/73, 110, 121; 347/233
See application file for complete search history.

(56) References Cited

U.S. PATENT DOCUMENTS 4,547,882 A   10/1985   Tanner
5,327,338 A   7/1994   Allen et al.
5,418,796 A   5/1995   Price et al.

(Continued)

FOREIGN PATENT DOCUMENTS

EP    1083462    3/2001

(Continued)

OTHER PUBLICATIONS

Seong-Yong-Moon et al. "Analysis of Photomask Distortion Caused by Blank Materials and Open Rations," in Proceedings of the 20th Annual BACUS Symposium on Photomask Tech. and Management, SPIE vol. 4186, Jan. 2001.

(Continued)

*Primary Examiner*—Stacy A Whitmore
(74) *Attorney, Agent, or Firm*—Haynes Beffel & Wolfeld, LLP; Ernest J. Beffel, Jr.

(57) ABSTRACT

The invention relates to production and precision patterning of work pieces, including manufacture of photomask for photolithography and direct writing on other substrates, such as semiconductor substrates. In particular, it relates to applying corrections to pattern data, such as corrections for distortions in the field of an SLM exposure stamp. It may be used to produce a device on a substrate. Alternatively, the present invention may be practiced as a device practicing disclosed methods or as an article of manufacture, particularly a memory, either volatile or non-volatile memory, including a program adapted to carry out the disclosed methods.

27 Claims, 25 Drawing Sheets

U.S. PATENT DOCUMENTS

| | | |
|---|---|---|
| 5,539,567 A | 7/1996 | Lin et al. |
| 5,539,568 A | 7/1996 | Lin et al. |
| 6,201,559 B1 | 3/2001 | Wada et al. |
| 6,281,931 B1 | 8/2001 | Tsao et al. |
| 6,312,134 B1 | 11/2001 | Jain et al. |
| 6,618,185 B2 | 9/2003 | Sandstrom et al. |
| 6,687,041 B1 | 2/2004 | Sandstrom et al. |
| 6,717,097 B1 | 4/2004 | Sandstrom et al. |
| 7,328,425 B2 | 2/2008 | Olsson et al. |
| 2003/0202233 A1 | 10/2003 | Sandstrom |
| 2006/0103914 A1 | 5/2006 | Sandstrom |

FOREIGN PATENT DOCUMENTS

| | | |
|---|---|---|
| JP | 60107832 A | 6/1985 |
| JP | 4252666 A | 9/1992 |
| JP | 6066890 A | 3/1994 |
| JP | 11329961 A | 11/1999 |
| JP | 2002169109 A | 6/2002 |
| JP | 2002196275 A | 7/2002 |
| WO | WO-9945439 A1 | 9/1999 |
| WO | 03/023488 A1 | 3/2003 |

OTHER PUBLICATIONS

Dodgson, N.A. "Image Resampling," Wolfson College & Computer Laboratory, University of Cambridge, Technical Report No. 261 (Aug. 1992).

International Search Report of International Application No. PCT/SE99/00310 mailed on Jun. 28, 1999.

International Preliminary Report on Patentability for International Application No. PCT/SE2005/000002, completed Jan. 30, 2006.

PCT communication for International Application No. PCT/SE2005/000002 mailed on Oct. 24, 2005.

"Reply to Written Opinion of Sep. 7, 2005" in connection with International Application No. PCT/SE2005/000002, dated Sep. 13, 2005.

Written Opinion of International Searching Authority for International Application No. PCT/SE2005/000002 mailed on Jul. 7, 2005.

International Search Report for International Application No. PCT/SE2005/000002, mailed on Jul. 7, 2005.

Translation of Official Action for Japanese Patent Appln. No. 2006-549183, mailed Aug. 7, 2009.

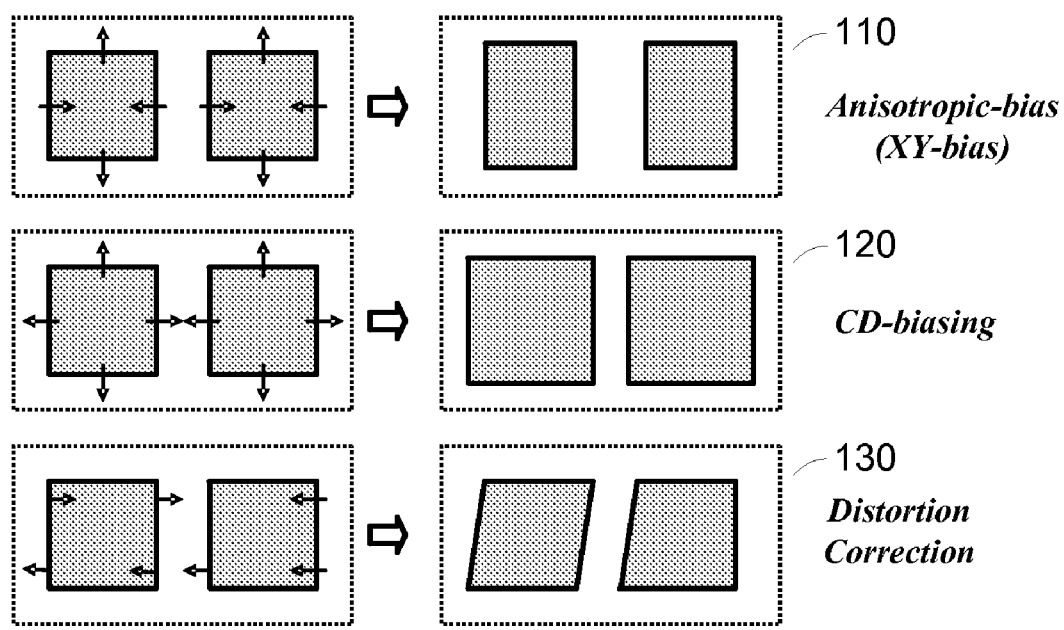
- 110 *Anisotropic-bias (XY-bias)*
- 120 *CD-biasing*
- 130 *Distortion Correction*
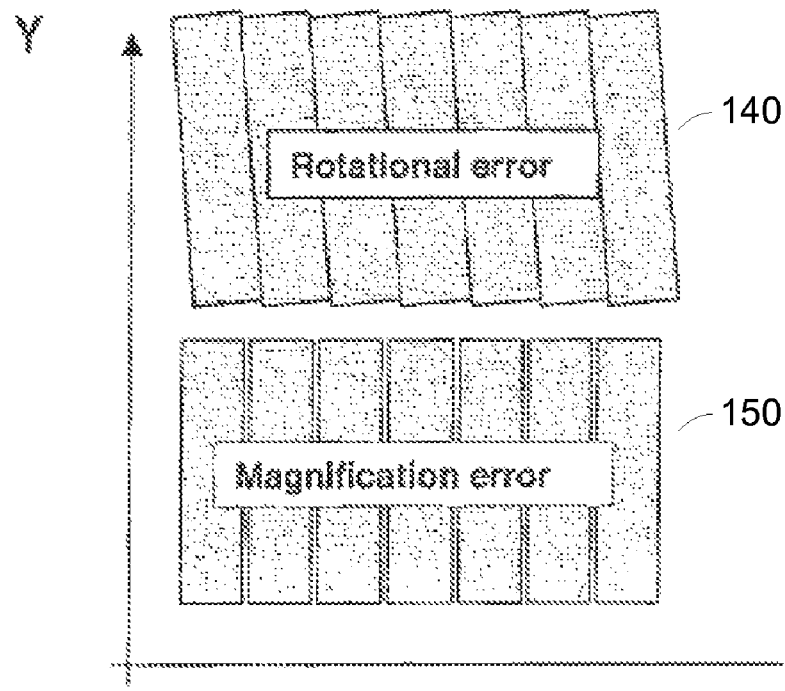
- 140 Rotational error
- 150 Magnification error
Fig. 1

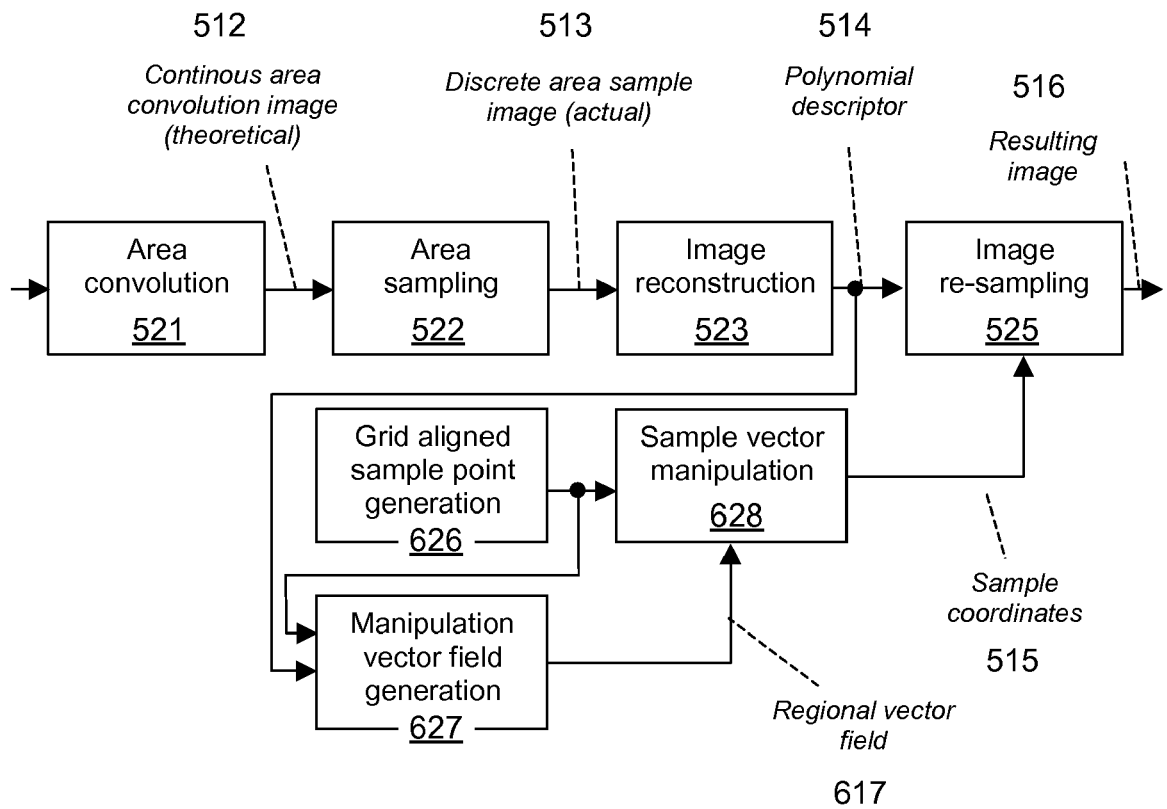
Fig. 6
= Original sampling point
= Manipulated sampling point
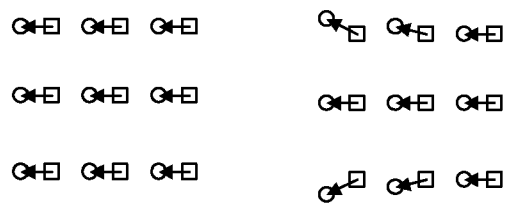
(1) Translation
710
(2) Distorsion
720
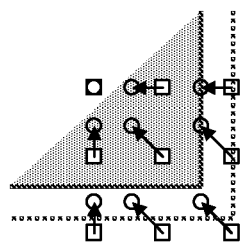
(3) CD bias
730
Fig. 7

*a) Actual profile*     *b) Sampled and linearly reconstructed profile*

*c) Resampled profile*     *d) Nearest-neighbor sampling*

| Isolated corner – High rating | Curve approximation -Low rating | Interfering corner(s) -Low or high rating | Interfering edge -Low or high rating |
|---|---|---|---|
| 5411 | 5412 | 5413 | 5414 |

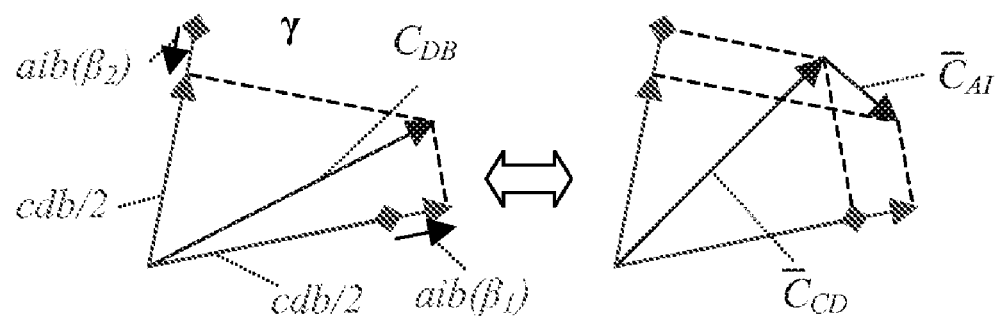
Fig. 56A-B
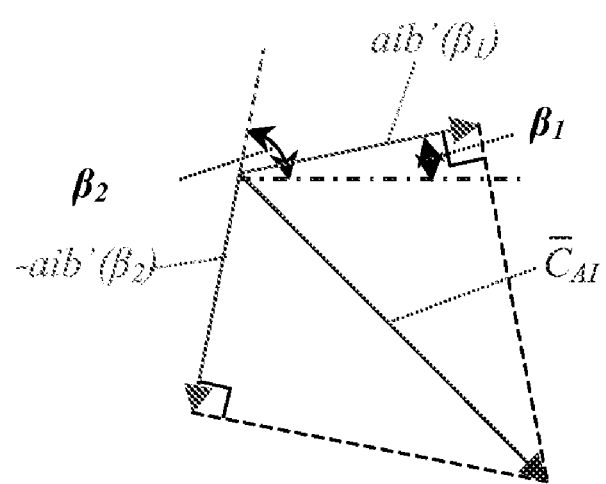
Fig. 57

US 7,842,926 B2

METHOD AND DEVICE FOR CORRECTING SLM STAMP IMAGE IMPERFECTIONS

RELATED APPLICATIONS

This application is a continuation of U.S. Pat. No. 7,328, 425, which claims the benefit of U.S. Provisional Patent Application No. 60/519,495 filed 12 Nov. 2003, having the same title and inventors. This application is further related to U.S. application Ser. No. 09/979,148, entitled "A Method for Error Reduction in Lithography", by inventors Torbjörn Sandström, Peter Ekberg, Per Askebjer, Mats Ekberg and Anders Thuren, filed on 22 May 2000, and claiming priority to Swedish Application No. 9901866-5, by the same title, by Applicant Micronic Laser Systems AB, filed on 20 May 1999, of the same family as WO 00/72090 A2. The parent, priority provisional and WO applications are hereby incorporated by reference.

BACKGROUND OF THE INVENTION

1. Field of the Invention

The invention relates to production and precision patterning of work pieces, including manufacture of photomask for photolithography and direct writing on other substrates, such as semiconductor substrates. In particular, it relates to applying corrections to pattern data, such as corrections for distortions in the field of an SLM exposure stamp. It may be used to produce a device on a substrate. Alternatively, the present invention may be practiced as a device practicing disclosed methods or as an article of manufacture, particularly a memory, either volatile or non-volatile memory, including a program adapted to carry out the disclosed methods. Additional aspects of the invention are further described in the accompanying description, figures and claims.

2. Related Art

A variety of distortions related to maskmaking are described in the WO application referred to above. These distortions typically relate to physical properties of the substrates on which the patterns are printed, i.e. the mask blanks and the wafers or panels, the position on the substrates, the exposing equipment (which can use electromagnetic radiation or particle beams) including the exposing sequence and environment, and the pattern itself. Other potential sources of distortion are noted.

Passing reference is made in the WO application to applying distortion corrections when writing directly to a workpiece using an SLM, on pages 31, 33, and 35-36. These references generally relate to correcting distortions using an SLM and do not describe distortions particular to an SLM.

Experience using an SLM has revealed that some additional types of distortion, not mentioning the WO application, arise when an SLM is used. Nominal stamp location, rotation and magnification errors are among the additional types of distortion that deserve attention, as is spatial distortion across the field of an SLM.

Accordingly, an opportunity arises to address types of distortion particular to the use of SLMs and to apply technologies particularly available in SLMs to a wide range of distortions.

SUMMARY OF THE INVENTION

The invention relates to production and precision patterning of work pieces, including manufacture of photomask for photolithography and direct writing on other substrates, such as semiconductor substrates. In particular, it relates to applying corrections to pattern data, such as corrections for distortions in the field of an SLM exposure stamp. It may be used to produce a device on a substrate. Alternatively, the present invention may be practiced as a device practicing disclosed methods or as an article of manufacture, particularly a memory, either volatile or non-volatile memory, including a program adapted to carry out the disclosed methods. Additional aspects of the invention are further described in the accompanying description, figures and claims.

It is therefore an object of the present invention to provide an improved pattern generator for printing of precision patterns. This object is achieved with an apparatus according to the appended claims, providing an analog modulation of the pixels in the SLM.

BRIEF DESCRIPTION OF THE DRAWINGS

FIG. 1 illustrates anisotropic biasing, isotropic biasing, distortion correction, rotation and magnification.

FIG. 6 adds to FIG. 5 details of image re-sampling manipulation.

FIG. 7 illustrates gradients along an iso-level intensity curve at a corner.

FIGS. 42-44, 45A-B, and 46A-B illustrate alternative corner resizing approaches.

FIG. 56A-B illustrate how the aggregate contribution to the Dimension Bias Corner Displacement vector can be decomposed.

FIG. 57 shows how the bias component can be derived.

DETAILED DESCRIPTION

Figure 2:
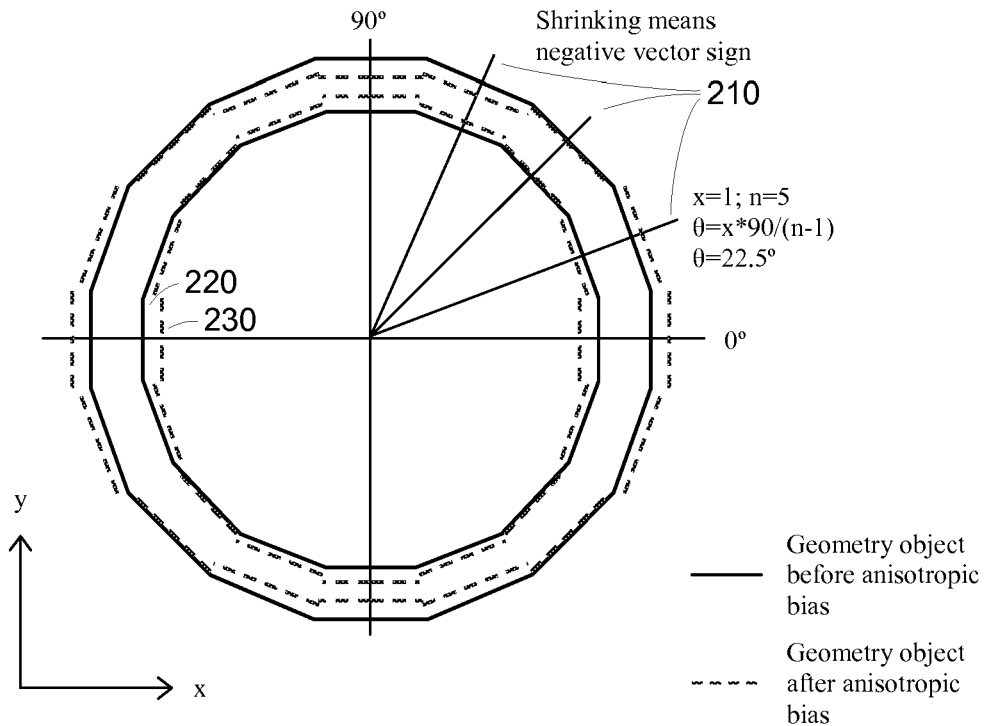
FIG. 2 illustrates anisotropic biasing.

The following detailed description is made with reference to the figures. Preferred embodiments are described to illustrate the present invention, not to limit its scope, which is defined by the claims. Those of ordinary skill in the art will recognize a variety of equivalent variations on the description that follows.

Types of Corrections

Rasterization of vector pattern data and conversion of raster data into mirror orientations and mirror driving voltages, to relay radiation to an image plane and expose resist on a mask, directly written device or other workpiece was the subject of U.S. patent application Ser. No. 09/954,721, entitled "Graphics Engine for High Precision Lithography", filed 12 Sep. 2001, which is hereby incorporated by reference. In subsequent work, the inventors have developed a new approach that enables distortion correction and anisotropic biasing of features, using area resampling with a priori knowledge. This new approach has several applications. FIG. 1 illustrates anisotropic biasing of features 110, isotropic biasing 120, distortion correction 130, rotation 140 and magnification 150. Anisotropic biasing refers to changing X and Y extents of a feature by differing amounts 110. Isotropic biasing applies similar changes in feature extents 120. Distortion correction is non-uniform across the image field. Rotation and magnification can be applied to an entire image. In addition, translation errors (not illustrated) can be addressed by resampling.

Anisotropic biasing is illustrated by FIG. 2. A set of anisotropic bias vectors defines orientations and displacements. A feature's size can be increased or decreased, depending on the displacements of the bias vectors. In one embodiment, bias vectors 210 are determined for only one quadrant of the vector circle and then mirrored across the X and Y axes. The solid lines 220 in the figure illustrate the object geometry before anisotropic bias and the dashed lines 230 illustrate the object geometry after application of the bias.

Figure 3:
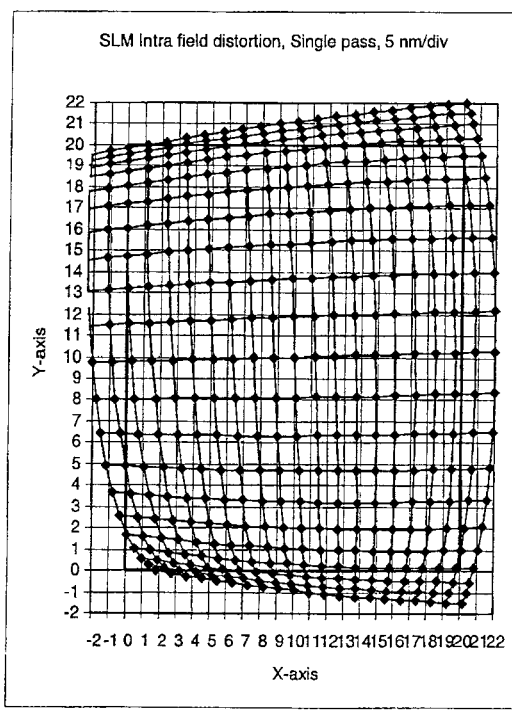
FIG. 3 is a sample distortion map.

Distortion correction refers to compensation for distortions across the image field, for instance distortions introduced by the image producing system, including mirrors or lenses that relay radiation. Distortion mapping can be performed in an ordinary way using a metrology tool such as a Leica IPRO. A Leica application note regarding distortion mapping by Seong-Yong-Moon et al., is entitled "Analysis of Photomask Distortion Caused by Blank Materials and Open Ratios," in *Proceedings of the 20th Annual BACUS Symposium on Photomask Technology and Management*, SPIE Vol. 4186, and reportedly was published in January 2001. FIG. 3 is a sample distortion map, of a type that could be prepared using the Leica IPRO, beginning with a sparse map and deriving additional points. This is a typical simulated 2D placement error over a 50 by 200 um SLM stamp, which depicts small errors in the 10-20 nm range.

Rotation, magnification and translation are standard image manipulations, implemented in a special way that accommodates real time processing of large data volumes.

Corner enhancement, which may benefit from the same methodology applied to biasing and distortion correction, is beyond the scope of this disclosure.

Resampling Methodology

Following is a description of a method of sampling, reconstructing and re-sampling an image data descriptor in the form of a pixel raster, arriving at a new image descriptor also in the form of a pixel raster. For background, a paper by Neil Anthon Dodgson, "Image Resampling", Wolfson College & Computer Laboratory, University of Cambridge, Technical Report Number 261 (August 1992) and particularly Chapters 6-7 is recommended.

This method allows properties such as gradients or thresholds to be extracted from a reconstructed image. Outgoing from these image dependent properties and other image independent properties, a series of pattern manipulations can be applied to alter the locations of re-sampling coordinates and/or superimposes multiple image planes. The manipulations mentioned above include critical dimension biasing, corner enhancement, distortion compensation, proximity effects (representing interaction between sub-surfaces or features of an image, not included in this disclosure), alteration of the sample grid, resulting in new spatial distance between sample points (enlarge/shrink) and translations of the entire pattern to reflect on grid phase shifts.

The images, the source as well as the resultant, can be described as a scalar function of a coordinate vector relating to an origin of the image plane. The images of this description all have a finite extent.

Applying this method, instead of manipulating the image content, sample points are manipulated. Alteration of a relatively few, discrete sample points is more efficient than moving the entire image, which can be treated in continuous space as having infinite resolution. Even with a discrete image, the number of data points required to represent the image content is many times greater than the number of sampling points.

Image Representations

The method uses the concept of infinite resolution, or continuous image plane, in an image intensity domain. In this case, the number of coordinate vectors is infinite, representing the infinite set of points constituting the image plane.

For every image we thus have (at least) two representations, the continuous image plane and the discrete image plane. (In other contexts, this might be referred to as the object plane, corresponding to the surface of an SLM, as opposed to the surface of a workpiece.) The scalar representing the amplitude value of each point in either the continuous or the discrete image plane may in turn be represented with a continuous or a discrete value.

For each point in the image plane of the original image, prior to any filtering or convolution, an original image function I(x,y) is assigned to represent the value in that point. It is spatially and value-wise discrete. This function can be sampled and denoted $I_m(x_m,y_m)$, where $x_m$ and $y_m$ are members of a finite set defining all the sample points of the (finite extension) image.

The method is in many aspects general with respect to scalar properties of I(x,y), but in the application targeted, only a special case when the original image I(x,y) is a binary value set containing only pixel values I=0 and I=1.

Area Sampling

Area sampling is usually thought of as a discrete sample of a discrete and finite area of an image, for example a pixel or a set of pixels. However, for this particular purpose instead the concept of an infinite resolution area sampling is considered. For each point $(x_m,y_m)$ in an infinite resolution image there exists an area sample such that the value of the area sample is the integral of the image point function over an area defined by a spatial extension.

$$A(x,y) = \iint I(u,v) du\, dv$$

In the expression, u and v are variables representing the finite plane of the area sample. A plurality of shapes can be considered, but for this descriptor a square sample area is considered. (A rectangular or circular area may be considered as an extension of the method). The square sample has an extent h such that the integral above is limited by x=(x−h/2,x+h/2) and y=(y−h/2,y+h/2). Applied to a square sampling area, the integral becomes:

$$A(x,y) = \frac{\iint\limits_{\substack{u=(x-h/2,x+h/2)\\v=(y-h/2,y+h/2)}} I(u,v)du\,dv}{\iint\limits_{\substack{u=(x-h/2,x+h/2)\\v=(y-h/2,y+h/2)}} 1\,du\,dv} = \frac{\iint\limits_{\substack{u=(x-h/2,x+h/2)\\v=(y-h/2,y+h/2)}} I(u,v)du\,dv}{h^2}$$

Figure 4:
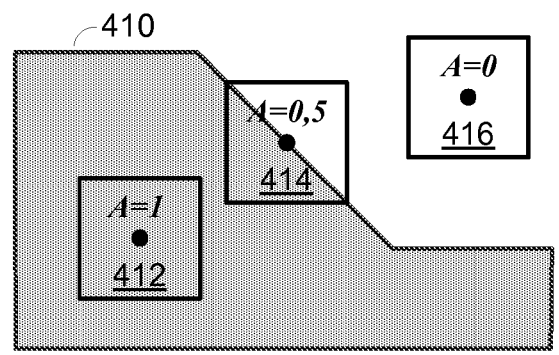
FIG. 4 illustrates area sampling.

Area sampling rendering refers to estimating the values of the function A(x,y) with a discrete value and a discrete set of pixels. The notation $\tilde{A}_m(x_m,y_m)$ is used to represent these estimates. FIG. 4 illustrates area sampling of a feature 410, with results of A=1 (412), A=0.5 (414) and A=0 (416).

The area sample dimension and magnitude will correlate with the chosen length units, and changes to the convolution square will change the magnitude of A(x,y). This introduces a practical dependency between parameters of the system. This text from this point on will use the normalized area sample, expressed as the area sample value integrated over bi-level original image function I(x,y) of values 0 and 1, divided by the area of the convolution square. This way, the area sample varies between 0 and 1.

Image Reconstruction

This section elaborates over a way of reconstructing the continuous square area convolution image A(x,y) outgoing from a set of discrete sample estimates $\tilde{A}[x_m,y_m]$.

This reconstruction method relies on the selection of sample points $(x_m,y_m)$. The sample points are selected in an orthogonal coordinate system in such a way that x=g*{0 . . . p}, where g is a sample distance measured in the original image plane, and y=g*{0 . . . q}, and p and q denotes the pixel size of the image.

The relation between the extent h of the area sample (see above), and the distance g between sample points is important from an implementation point of view, but is not a fundamental prerequisite. For implementations in computer technology, values of $g=2^m$ are of particular interest (under the assumption that there is a minimal distance unit of 1). With this limitation, area samples of a size $h=2^t$ are of particular interest. However, the method does not fundamentally limit itself to this.

Estimation of Arbitrary Sample Points in the Continuous Image Plane

With the aid of the area sample estimates $\tilde{A}_m[x_m,y_m]$, the function A(x,y) can be estimated by using one of several reconstruction methods. One of the simplest (aside from 'nearest neighbor' which is not considered) is linear interpolation. The method of linear interpolation can be easily extended into the two-dimensional image plane by using three sample points as corners of a fictive triangle, forming a plane from which samples can be taken.

The method of arriving at the value of $A_p[x_p,y_p]$ can thus be expressed as the following steps:

1. Find the set of three discrete sample points (a,b,c) being in the closest proximity of the sample point $(x_p,y_p)$. It can be shown that with the limitations in the sample grid of $x_m$ and $y_m$ introduced in an earlier step, at least two $x_m$ values or two $y_m$ values in the set of m=(a,b,c) will be the same. If multiple sets fulfill the condition (for cases where $X=x_a$, a being a member of the set), it can be shown that the choice does not matter, and an arbitrary set of the ones fulfilling the proximity condition can be selected.
2. Find the sample pair (a,b) that has different values of x, and another (a,c) that has different values of y.
3. Use linear interpolation to calculate a new area sample estimate $\tilde{A}'(x,y)=(\tilde{A}[x_a,y_a]-\tilde{A}[x_b,y_b])*(x-x_a)+\tilde{A}[x_a,y_a]-\tilde{A}[x_c,y_c](y-y_a)+\tilde{A}[x_a,y_a]$.

The error compared to the actual image A(x,y) is proportional to the values of h and g (area sample convolution size and sample distance), and it can be shown that the maximum error diminishes when g approaches zero under constant h.

The area convolution process has a filtering characteristic, and typically details in the convolved original image will be rounded off or completely attenuated. With lower values of h, this detail attenuation will lessen, but another negative effect arises: With lower values of h an increased sensitivity to resolution limitations in the original image will show up, and therefore decreasing h may prove to have negative impact on the fidelity.

A method of refining the method of interpolation and reconstruction will be described later, that will provide an alternative to increasing the sample density (or decreasing g).

Figure 5:
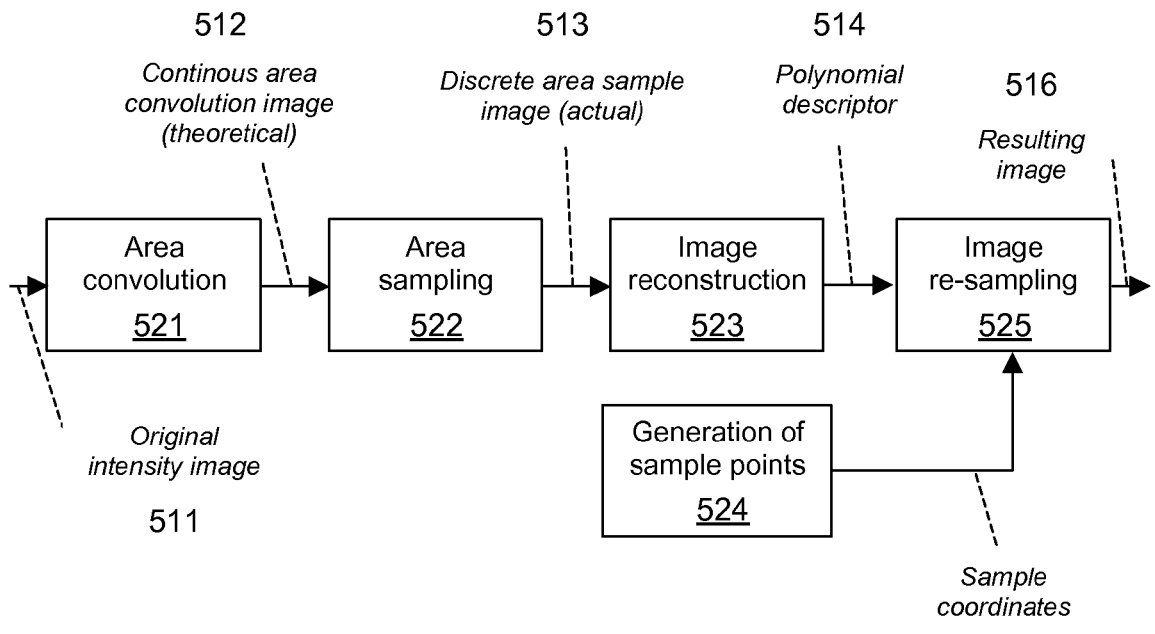
FIG. 5 is a conceptual block diagram of sampling, reconstruction and re-sampling.

FIG. 5 is a conceptual block diagram of sampling, reconstruction and re-sampling. The illustrated method begins with an original intensity image 511. An area convolution 521 theoretically produces a continuous area convolution image 512. Area sampling 522 produces a discrete area sample image 513, a set of intensities at discrete points. Image reconstruction 523, described below, is applied in the neighbor of a sample point 515. From the intensity characteristics of the neighborhood, for instance a 4×4 neighborhood of discrete samples, a polynomial descriptor 516 is derived that can be used for image re-sampling. In image re-sampling 525, a sample coordinate 515 and a polynomial descriptor 514 are combined to produce a re-sampled point of the resulting image 516.

Manipulating the Image

FIG. 6 adds to FIG. 5 details of image re-sampling manipulation. Generation of sample points 524 is detailed by a grid aligned sample point generation 626, manipulation vector field generation 627 and sample vector manipulation 628.

Defining Alternate Sampling Points

A set of new sampling points $(u_m, w_m)$ is now introduced. The sampling points are considered to originate from a discrete, axis-wise equidistant distribution such as in the case with the samples of the original image. The originating sample point set is denoted $G[m]=(x_m, y_m)$. This means that for each sample point m there is a corresponding coordinate $(x_m, y_m)$.

To model important prerequisites for the re-sampling, three contributors that slightly alter the positions of these samples are considered:

1. An image plane translation 710. This contributor is denoted $T=(x_t, y_t)$, and is a constant vector, spatially invariant.
2. An image plane spatially dependent relocation vector 720. This contributor is denoted $D(x,y)$ and is a function of the coordinates x and y but independent of the image content $A(x,y)$.
3. An image plane pattern dependent relocation vector 730. This is denoted $C(x,y,A(x,y))$, where C is depending on the pattern area sample image $A(x,y)$.

Referring to FIG. 7, the purpose of (1) a translation 710 of the image plane is achieving the equivalent of having moved the entire originating area sample image $A(x,y)$ with a constant coordinate offset vector T, so that the resulting image $A_R(x,y)=A_R(x-x_t, y-y_t)$. The purpose of applying spatially dependent vectors 720 is to represent a series of spatial distortions, including rotation, cushion distortion, trapezoidal distortion and any combination or other distortion that can be modeled as a function of x and y. The purpose of CD bias adjustment 730 is to achieve the equivalent of changing dimensions of sub-surfaces in the pattern by altering sample points in the proximity of edges in a direction perpendicular to the extent of the surface edge.

CD Bias Gradients

Figure 8:
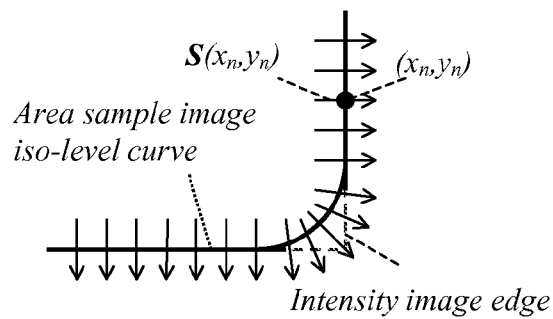
FIG. 8 illustrates a useful estimate of the gradient found in the iso-level curves

Referring to FIG. 8, to achieve C, another vector field S is used. S is calculated from $A(x,y)$ in such a way that S represents or estimates the normalized gradient of $A(x,y)$, where $S=\text{grad}(A)*k$, where k is chosen so that $|S|=1$ except when S is zero. A useful estimate of the gradient be found in the iso-level curves, illustrated by FIG. 8, and in particular the iso-level curve of half the maximum amplitude of $A(x,y)$, but the gradient may also be derived directly from the reconstructed area sample image $A(x,y)$.

To get from S to C, a series of operations are performed. The concept of "extension" of a vector field S into S' is introduced. This can be interpreted so that the value of S' equals S within a defined region. For areas where the gradient is ambiguous, for example at the inside of a corner or curvature, a method of selecting one gradient among many needs to be defined. For the continuous domain, this has not yet been satisfactorily addressed, but for a discrete area sample image, a method of selection is proposed.

Several methods of identifying the extended vector field S may be used. Instead of deriving the gradient directly from the $A(x,y)$ image, the iso-level lines are used, and in a piecewise linear interpolation along the curve of iso-level, for each piece a rectangular gradient surface is constructed, designed so that the gradient is constant and directed in the normal direction of the iso-level line segment. The rectangle should be such that one side of the rectangle is parallel with the iso-level line segments and that the other extends in both directions, parallel to the gradient.

If multiple values are found, a special case needs to be addressed, as described below. S' is multiplied with a constant h to get C, where h is the scalar product between the CD parameter value vector and S. This results in the movement of geometry edges with a distance h. (An extension of the method for CD parameters that are separated in X-axis and Y-axis will be presented later, but the fundamental approach remains.)

The sample point in the re-sampling process is then created by superimposing all the sample vector contributors, T, D and C (adding them) to all the originating grid samples points $G[m]=[x_m, y_m]$, resulting in a new sample point Q.

Alternative models for deterring the S-field are presented below.

Sample Point Splitting

If multiple values of significantly different non-zero S' is found when the extension region is searched, the C vector is duplicated with one instance for every value of S. The sample point value is then derived from a weighted summation of the contribution from $A(x,y)$ in every point. This mechanism corresponds to input image situations where two objects in proximity of each other are shrunk or grown in a way that affects one and the same output sample value.

Iso-Level Line Cross-Point Search

The concept of finding points in the image of $A(x,y)$ in which A has a certain value can be useful for some operations. Therefore, a search method is described, resulting in an estimated representation of all such positions.

For the continuous Area Sample Image $A(x,y)$ an iso-level line can be conceived, representing the curve or curves at which the area sample value is of a certain amplitude $A_T$. As shown later, the curve following the path of half the maximum amplitude of A has particularly interesting properties. Hypothetically, if for a continuous region, $A(x,y)$ is constant, equaling the value of the curve searched, the curve will extend into an area. For all curve values strictly smaller than 1 and strictly large than 0, this is anticipated to occur so rarely that it can be treated as an exception or anomaly.

For any straight line between two points in the region where $A(x,y)$ is defined, the point at which A is exactly $A_T$, if such a point exists, is called the Iso-level cross-point.

In a hypothetical mesh connecting each sample with all of its neighbors, each mesh line can be assigned the value of intersection, or alternatively a nil value denoting the absence of a cross point at the extension of that mesh segment.

Finding Corners

Figure 9:
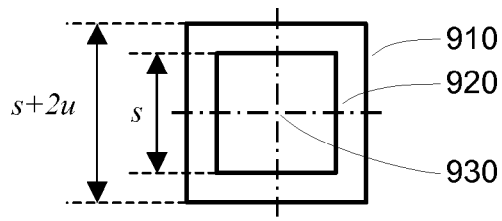
FIG. 9 illustrates how to find the exact position of corners in a pattern.

To find the exact position of corners in a pattern, the following method can be used. As depicted in FIG. 9, create two squares, one bigger 910 than the other 920, distanced by a rim of width u such that the center-points 930 of the two squares coincide. If the size of the smaller rectangle is defined as s, the size of the larger hence is s+2u. Search the lines of these squares for points where the value $A(x,y)$ is exactly half the maximum amplitude.

Figure 10:
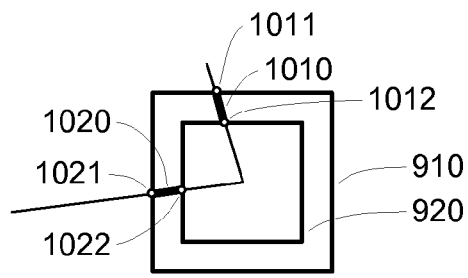
FIG. 10 illustrates how to find the hypothetical corner of the underlying binary pattern.

Now, in FIG. 10, create vectors 1010, 1020 between pairs of points where one point is on the outer square 1011, 1021 and one on the inner 1012, 1022. In most cases four points, and two vectors are found. Now find the crossing point inside the smaller square between these two factors by using extrapolation. The crossing point represents a hypothetical corner of the underlying binary pattern.

Enhancing the Corner Search

By taking the value A(x,y) and subtracting it from ½, a metric proportional to the angle of the corner is found. Using a translation function, the angle can be derived from the A−½ difference. The angle can also be measured by calculating the angular difference between the two vectors. By comparing the two angle values it can be detected whether the alleged intersection point is real or the result of a smooth curvature.

It is advantageous to map the search rectangle in such a way that it is aligned with the discrete area sample grid lines, either actual sample values or from the proposed up-sampled set.

An extension of this method is to use two octagons instead of two squares 910, 920.

Extension of Image Reconstruction

The image reconstruction process aims at creating a polynomial representation of A(x,y) for any point in the area sample image, outgoing from discrete, equidistant area samples generated by the image source (i.e. the rendering processor).

The image reconstructor should be designed so that it makes little or no use of A Priori Knowledge (APK) of the pattern that has been sampled. Instead, APK of the sampling mechanism itself should be used.

The proposed method of image reconstruction described above is linear interpolation between known (or asserted) sample values. The following describes a method of increasing the number of sample points in the set used for linear interpolation (up-sampling), based on properties inherent in the sampling mechanism in combination with a few assumptions on the underlying original image patterns.

To explain the design of the reconstructor, some conceptual elements should be introduced. Consider the square area sample A(x,y) of the original image. Then consider a line over which the area sample value is expressed as a function over that line in the form of a scalar value of a scalar line position A(s), where s is a position at the line relative to the line start position. The line can have any orientation, but as will be shown later, some orientations are of particular interest.

Figure 11:
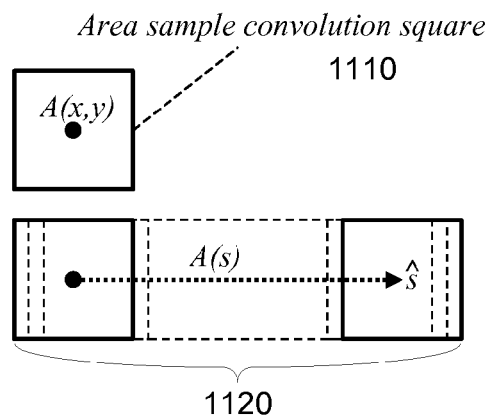
FIG. 11 depicts a square area convolution sampler.

FIG. 11 depicts a square area convolution sampler 1110 that can be applied as a sliding window 1120. The result of applying this convolution sampler across various intensity maps and profiles is illustrated in FIGS. 12-18.

Figure 12:
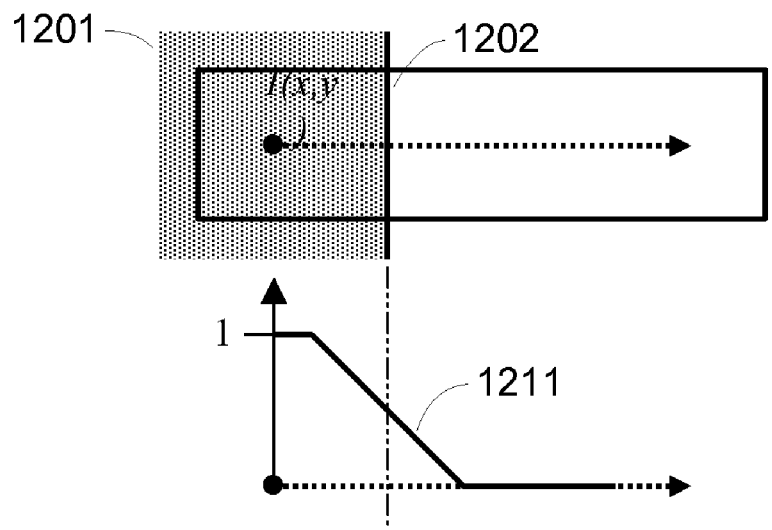
FIGS. 12-18 depict the result of applying the convolution sampler of FIG. 11 across a particular intensity map and profile.

In FIG. 12, the bright area 1201 is to the left of a vertical line 1202. In profile, the intensity encountered by a sliding window 1110 moving is represented by a sloped line 1211 ranging from bright (1) to dark (0) over a distance along the X axis equal to the width of the convolution sampler.

Figure 13:
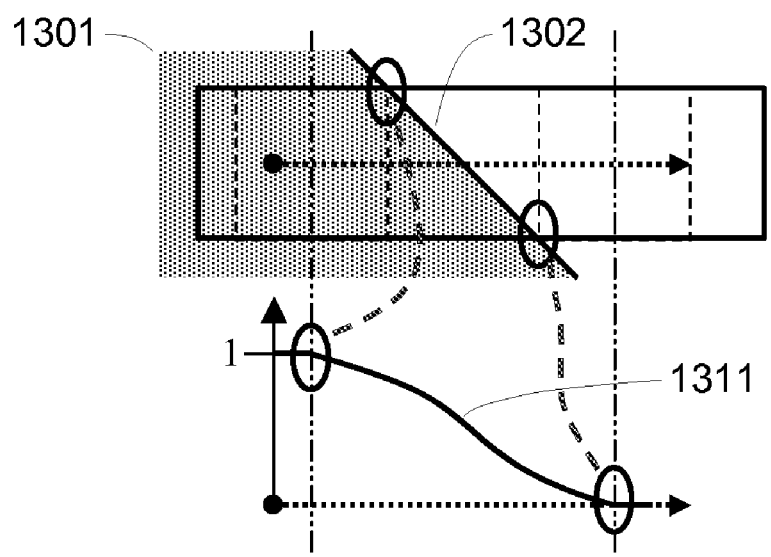

In FIG. 13, the bright area 1301 is to the left of a sloped line 1302. In profile, the intensity encountered by a sliding window 1110 moving is represented by a curved line ranging from bright (1) to dark (0) over a distance along the X axis equal to the width of the convolution sampler plus the distance traversed by the sloped line 1302.

Figure 14:
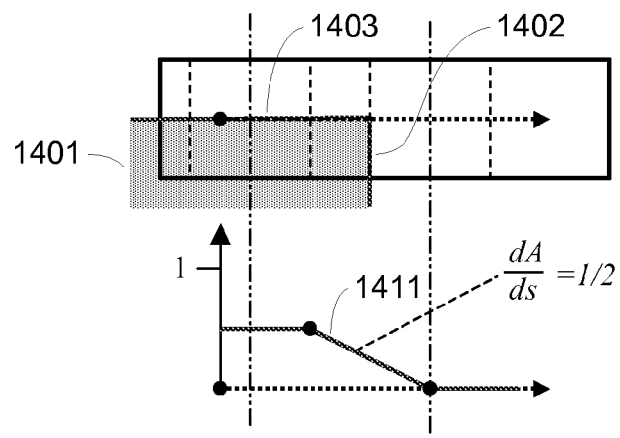

In FIG. 14, the bright area 1401 is a corner partially within the sampling region, to the left of a vertical line 1402 and below horizontal line 1403. In profile, the intensity encountered by a sliding window 1110 moving is represented by a sloped line 1411 ranging from half bright (½) to dark (0) over a distance along the X axis equal to the width of the convolution sampler.

Figure 15:
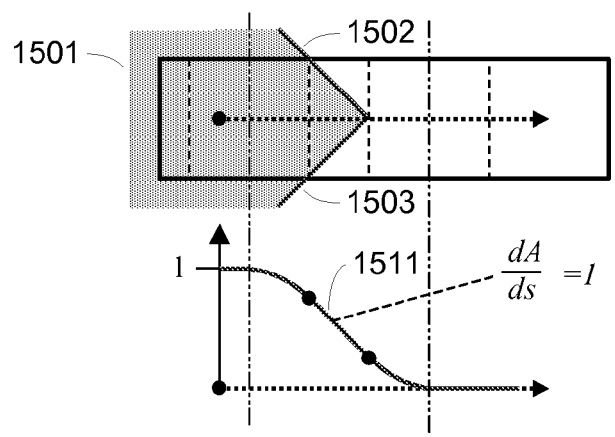

In FIG. 15, the bright area 1501 is a corner partially within the sampling region, to the left of sloped lines 1502 and 1503. In profile, the intensity encountered by a sliding window 1110 moving is represented by a curved line 1511 ranging from bright (1) to dark (0) over a distance along the X axis equal to the width of the convolution sampler plus the distance traversed by the sloped lines 1502, 1503.

Figure 16:
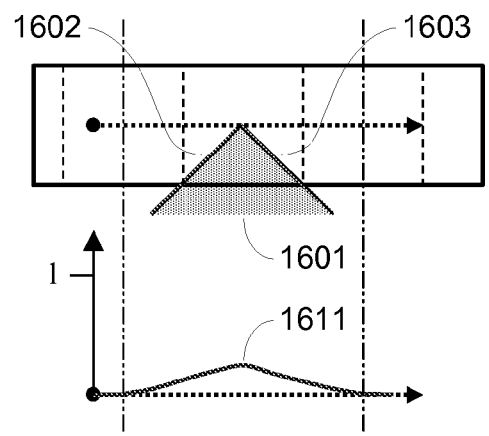

In FIG. 16, the bright area 1601 is a corner partially within the sampling region, below sloped lines 1602 and 1603. In profile, the intensity encountered by a sliding window 1110 moving is represented by a curved line 1611 ranging from dark to partially bright back to dark over a distance along the X axis equal to the width of the convolution sampler plus the distance traversed by the sloped lines 1602, 1603.

Figure 17:
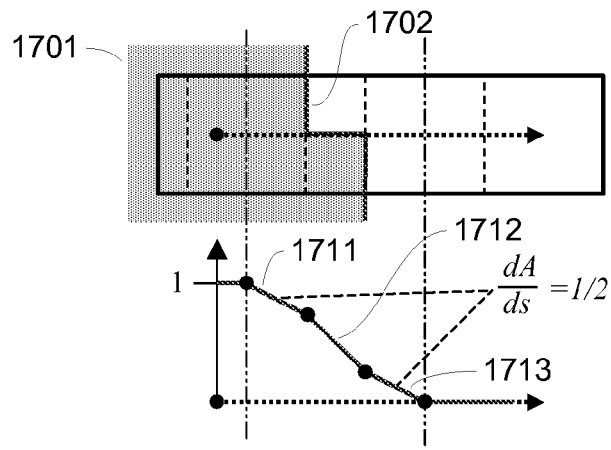

In FIG. 17, the bright area 1701 is a jogged corner pair within the sampling region, to the left of the jogged line 1702. In profile, the intensity encountered by a sliding window 1110 moving is represented by a three segmented line 1711, 1712, 1713 ranging from bright (1) to dark (0) over a distance along the X axis equal to the width of the convolution sampler plus the length of the jog.

Figure 18:
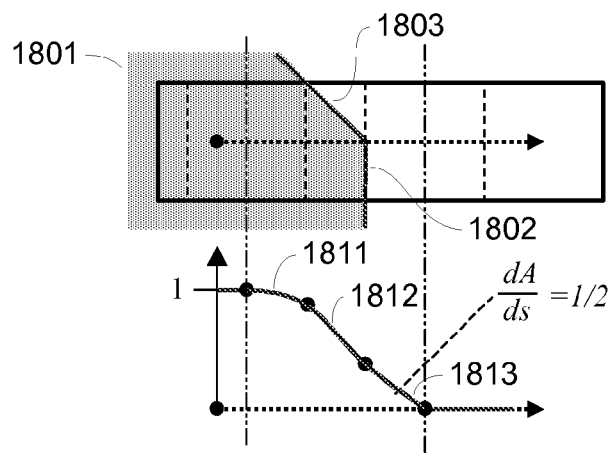

In FIG. 18, the bright area 1801 is an oblique corner partially within the sampling region, to the left of the vertical line 1802 and sloped line 1803. In profile, the intensity encountered by a sliding window 1110 moving is represented by a combination of a curve 1811 and two segmented lines 1812, 1813 ranging from bright (1) to dark (0) over a distance along the X axis equal to the width of the convolution sampler plus the distance covered by sloped line 1803.

By using the signatures of derivates of A(s) to categorize sequences, additional precision in estimation of values of A(s) between sample points $A(s_m)$ can be achieved. Understanding the results of applying area integrators to points along various feature edges, reconstruction and extrapolation/interpolation rules can be addressed.

Conditional Reconstructor

Figures 19A, 19B:
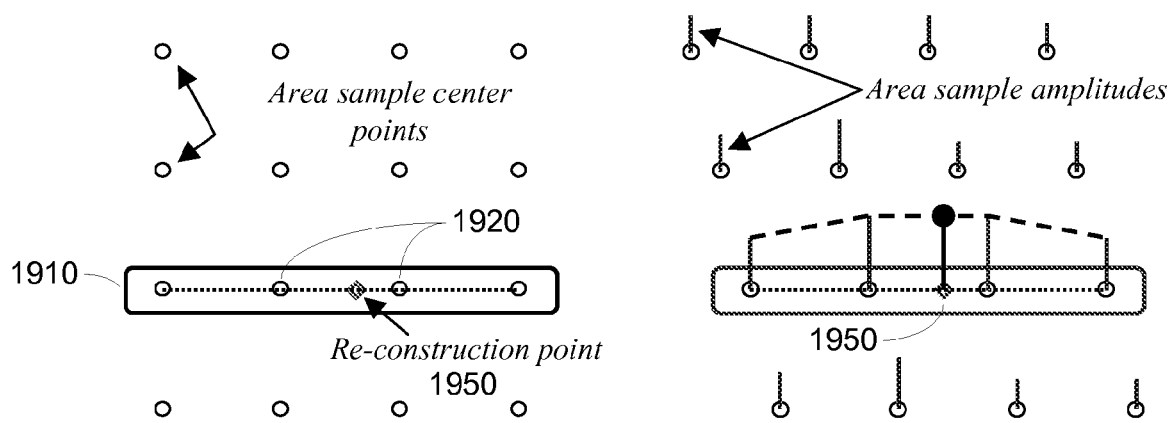
FIGS. 19A-19B depict sample sets used for reconstruction.

The basic element of the reconstructor operates in a one-dimensional context, reconstructing a new area sample value along a grid-aligned line of area samples, selected out of a 2-D array of area samples. The reconstructor 1910 uses four adjacent and overlapping area samples oriented along a line in an intensity surface to interpolate a value between the two central values. FIGS. 19A-19B depict sample sets used for reconstruction, top FIG. 19A and perspective views FIG. 19B. In this embodiment, a four-by-four sample neighborhood is used to reconstruct point 1950. In other embodiments, other sample neighborhoods could be used, such as 3×3, 5×5, 6×6 or a rectangular neighborhood. The four-by-four sample neighborhood is preferred as large enough to select among alternative interpolation paths and still relatively small. With four 1-dimensional reconstructions, the method can readily be extended directly to 2-dimensional reconstructions.

Figure 20:
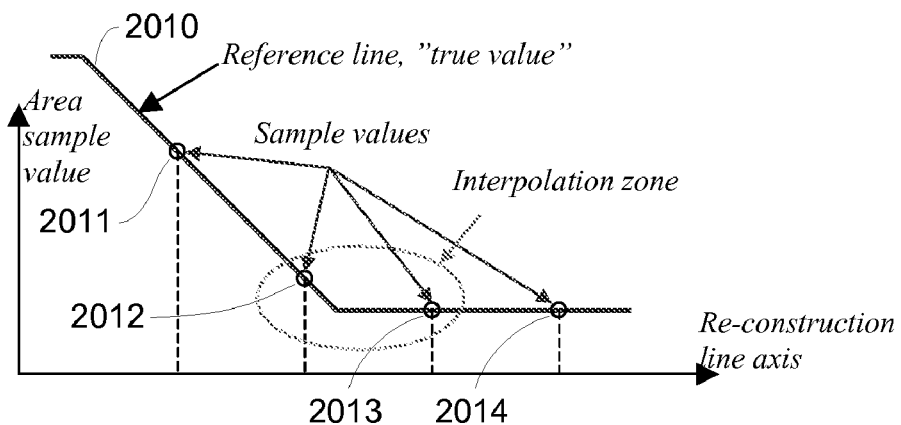
FIG. 20 illustrates a reference cross-section 2010 through an everywhere defined intensity surface.

FIG. 20 illustrates a reference cross-section 2010 through an everywhere defined intensity surface. The cross-section is derived from four area sample values, 2011-2014. As explained below, the reconstructor method chooses among interpolation and extrapolation paths. The choice of path is depending on an evaluation of the differences between the four sample values. The four samples are divided into three sample pairs, one "central" 2012, 2013 and two "peripheral" pairs (2011, 2012), (2013, 2014).

Important Criteria

A central reasoning behind the design of the interpolator is the tolerance differentiation between pattern cases, where the tolerance for corners is wider than the tolerance for Manhattan lines. The reconstructor is designed to yield a zero-error for reconstructed area samples at so-called Manhattan oriented lines, which produce rectangular features that resemble a skyline. Another important criteria is to build the interpolator from simple, linear operations, suitable for implementation in reconfigurable logic.

Path 1—Through Intersection of Extrapolations

Figure 21:
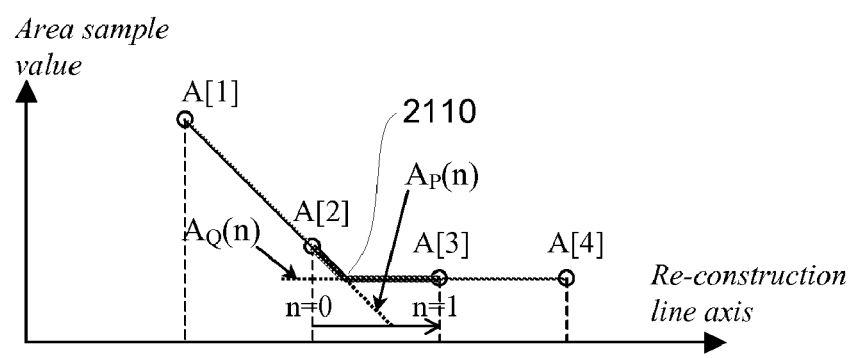
FIG. 21 illustrates using extensions of the adjacent line segments so that the first line is used for samples to the left of the intersection point and the second line for samples to the right of the intersection point.

Referring to FIG. 21, this path uses extensions of the adjacent line segments (A[1]-A[2]), (A[3]-A[4]), taking into account the intersection between the lines 2110 so that the first line is used for samples to the left of the intersection point and the second line for samples to the right of the intersection point. The scale of the area samples ranges from 0 to 1, 1 representing a completely covered area sample, 0 representing a completely empty sample. The extrapolation lines are limited by values 1 and 0, so that extrapolation never yields values greater than 1 or less than zero.

The mathematical expression is based on the parallel derivation of two extrapolated lines:

$$A_P(n)=\max(0,\min(1,((A[2]-A[1])*(n)+A[2])).$$

$$A_Q(n)=\max(0,\min(1,(A[4]-A[3])*(1-n)+A[3])).$$

Note that the intersection between the two does not necessarily exist. A simple test for the existence is to extrapolate $A_P$ and $A_Q$ for n=0 and n=1 and compare them with A[2] and A[3], respectively, and test if the signs match. If they do, the extrapolated lines never cross.

Let Delta[m] be the difference between the sample value and the extrapolated value:

$$Delta[2]=A_P(1)-A[3]$$

$$Delta[3]=A_Q(0)-A[2]$$

If Delta[2] and Delta[3] are equal, the intersection does not exist, and the path is not applicable.

Two distinct cases for selection of $A_P$ and $A_Q$ exist:

Delta[2]<0 or Delta[3]<0 in which case $A(n)=\max(A_P(n), A_Q(n))$.

Delta[2]>0 or Delta[3]>0 in which case $A(n)=\min(A_P(n), A_Q(n))$.

Path 2—Direct Linear Interpolation

Figure 22:
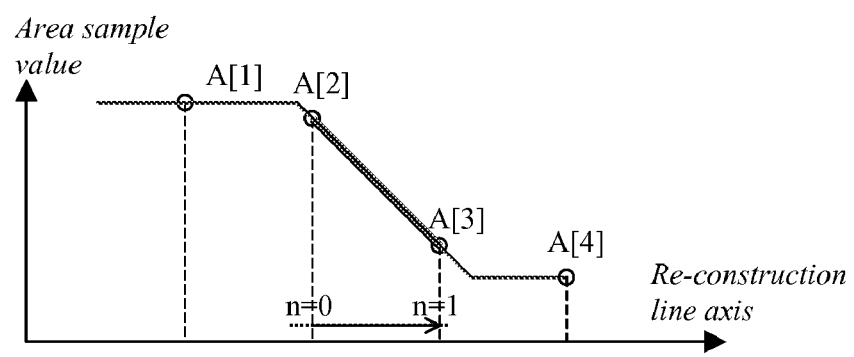
FIG. 22 illustrates the direct two-point interpolation applied to the central sample pair.

This path, illustrated by FIG. 22, uses the direct two-point interpolation applied to the central sample pair. The mathematical expression is $A_L(n)=A[2](1-n)+A[3](n)$.

Path 3—Weighted Interpolation Between Two Extrapolations

Figure 23:
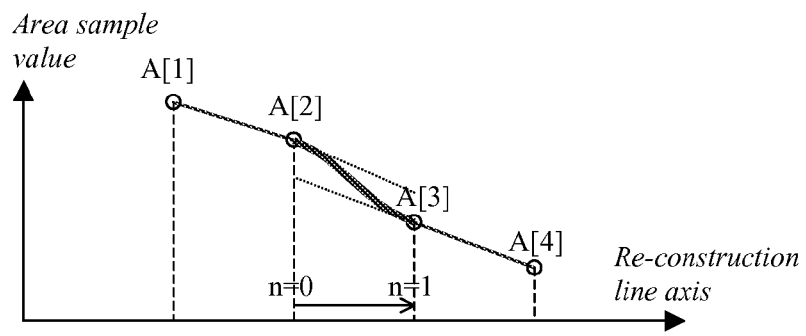
FIG. 23 illustrates the same extrapolations from FIG. 22 after limiting to 1 and 0.

This method, illustrated by FIG. 23, uses the same extrapolations (after limiting to 1 and 0) as in case 1. The two extrapolations are weighted so that the left extrapolation is dominant at point A[2] and the right extrapolation is dominant at point A[3]. The mathematical expression is $A_W(n)=A_P(n)*(1-n)+A_Q(n)*(n)$, where $A_P$ and $A_Q$ are the same expressions as in path 1.

Path 4—Weighting Between Path 2 and Path 3

Figure 24:
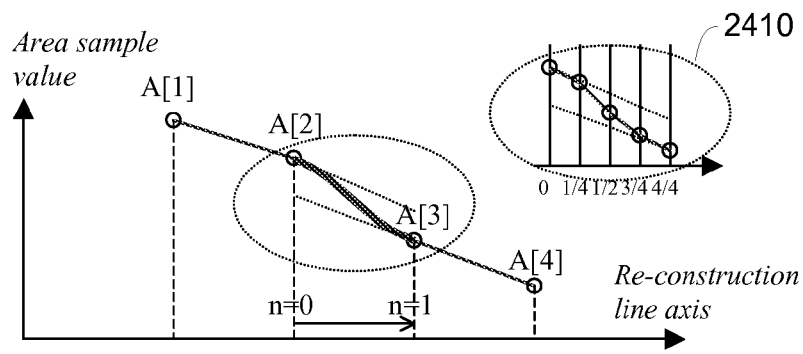
FIG. 24 illustrates the same extrapolations from FIG. 22 with weighting between extrapolations.

Weighting between paths 2 (Interpolation) and 3 (Weighting between extrapolations) 2410 gives slightly better results in some cases. The mathematical expression is $A(n)=A_W(n)/2+A_L(n)/2$. See FIG. 24.

Selecting Different Paths

When are the different paths preferred? Path 1 is preferred for sample points at the side of the area sample slope of isolated Manhattan lines. It yields a zero reconstruction error in this case. Path 1 is triggered when the derivate of the peripheral sample pairs is exactly 1, which is significant for the area sample image of Manhattan lines. Path 1 is also used when the sign of the derivates of the peripheral sample pairs differ, representing a "peak" without any flat level. This occurs, for example, at very narrow elements and non-Manhattan corners.

Path 2 is beneficial at samples point located directly at the area sample slope of isolated Manhattan lines. It yields a zero reconstruction error in this case. Path 2 is triggered when the derivate of the central sample pairs is exactly 1, which is significant for the area sample image of Manhattan lines.

Path 3 is used in other cases than path 1 and path 2, where derivate of the central sample pair is less than 1 and the derivate signs of the peripheral sample pairs are equal.

Further Consideration

Each reconstructor uses a plurality of multiplications. When the base is extrapolations, two multiplications are used; when the base is interpolations, one multiplication is used. In the case of weighting even more multiplication resources would be required, for what reason a piecewise linearization might be more efficient, reducing the multiplication effort to a lesser number.

Subdivision into Smaller Line Segments

Should the total number of interpolation multiplications exhaust the computational resources, there is a potential in subdivision of curves into piecewise linear segments. One would use the simple interpolation points (0, 1/4, 2/4, 3/4 and 4/4) to derive end-points for one high resolution, true interpolation. These simple interpolation points result in an adder-tree with only two elements, since only two binary digits are used for the coefficient.

Extending the Reconstructor into Two Dimensions

Figure 25A:
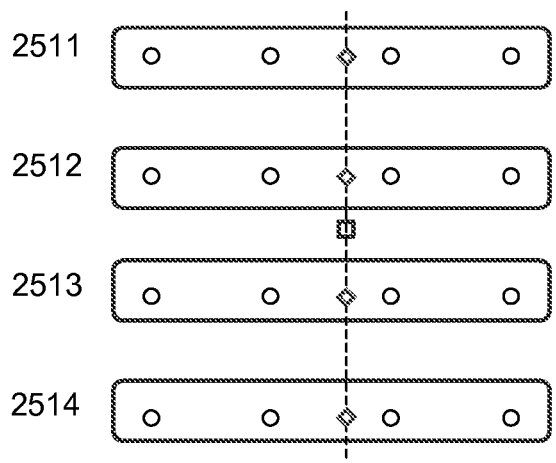
FIG. 25A-B illustrate how the 1-dimensional reconstructor can be extended into two dimensions.
Figure 25B:
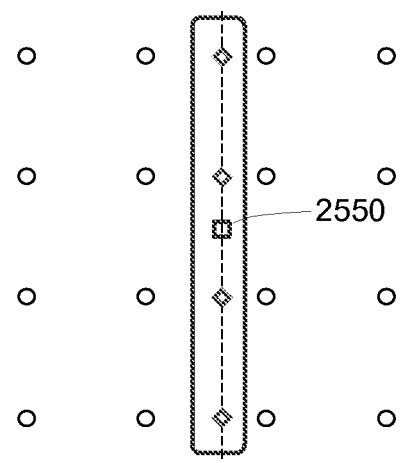

The 1-dimensional reconstructor can be extended into two dimensions as illustrated in FIG. 25A-B. First interpolate in X-direction using four sample sets of four samples each 2511-2514. This yields four new reconstructed samples aligned in Y as shown in FIG. 25A. Then interpolate in Y-direction (FIG. 25B) using the new four samples to yield the sought sample 2550. Since the rules for path selection apply for any grid aligned line, this should yield good results, or even perfect results for Manhattan-oriented feature edges.

Further Process Description

This section explains the processes engaged in the different function blocks of the RID architecture, which is presented below.

Area Sample Image Generation

Conceptual Description of Area Sampling

An area sample, again, is the image sample value resulting from the integral over a square area of a source image defined by the bi-level high-resolution pattern image defined by the geometry vector descriptors. The area sampling process can conceptually be subdivided into the process of convolving the source image with an integral function and the sampling this everywhere-defined convolved image at discrete sampling points. In practice, the everywhere-defined convolved image cannot easily be implemented, nor the integral of a surface defined by vectors, and area samples are for practical reasons generated as estimates of the above integral by aggregating and super-sampling the micro-pixel resolution image generated by the rendering processor.

Area Sample Image Generation by Aggregation and Super-Sampling

Figure 26:
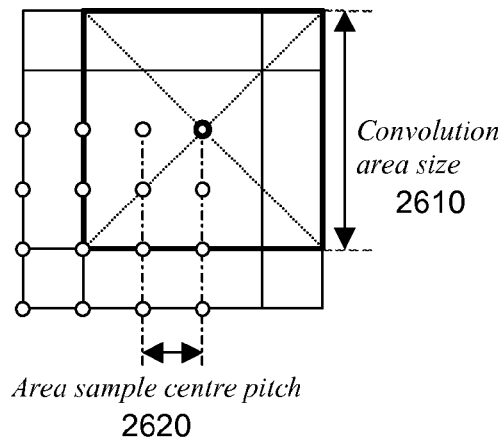
FIG. 26 illustrate the resolution defined as the combined parameterization of pitch and convolution area.

Area Sample Images in the AP framework are generated with different resolutions for different purposes. The resolution is defined as the combined parameterization of pitch and convolution area 2610, depicted in FIG. 26. If the pitch is smaller than the convolution area size, the area samples overlap, which is an important property for the re-sampling processes. Pitch denotes the distance between area sample center points. Convolution area denotes the area over which the underlying source image is integrated.

Figures 27A, 27B:
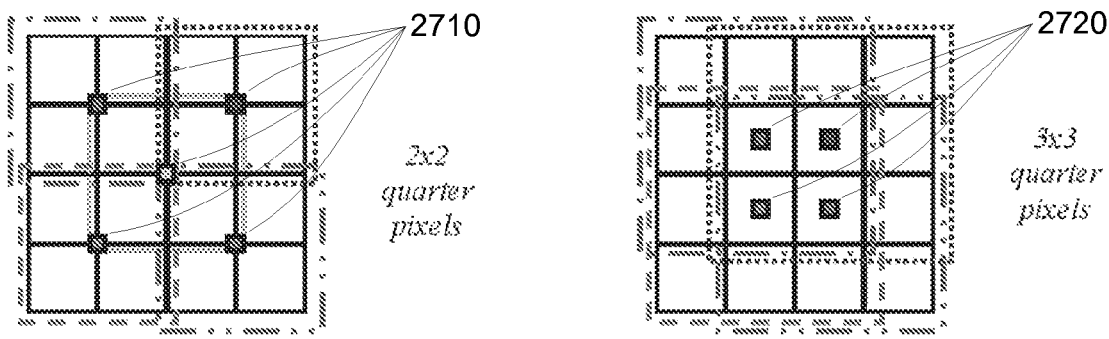
FIGS. 27A-B depict even and odd supersampling and aggregation.

By aggregating and super-sampling (in this case, summation) smaller area samples, larger area samples with dense pitches and overlapping sample areas can be created. The center points of the aggregated samples have different relations to the centers of the smaller samples depending on whether the large area is an even or odd multiple of areas. Even and odd supersampling and aggregation are depicted in FIG. 27A-B. In FIG. 27A, super-sampling combines four quarter-pixel areas into a single sample; five samples and their centers are depicted 2710. In FIG. 27B, super-sampling combines nine quarter-pixel areas into a single sample; four samples and their centers are depicted 2720.

Isotropic and Anisotropic Dimension Biasing

Dimension bias is sometimes used as a collective notation for isotropic bias and anisotropic bias. Isotropic bias, also known as CD bias, is in one embodiment a rotation symmetrical, user defined, spatially and temporally variant parameter. Anisotropic bias is asymmetrical and angle dependent, derived from fundamental machine properties and temporally and spatially invariant. The one embodiment of the aggregate effect of these two biases in the context of sampling point displacement includes separating the Bias Vector into components, which are each multiplied with a factor derived from an anisotropic bias function (aib) table and a CD-Bias (cdb) value parameter, in the form {aib(edge_angle), cdb}. The aib table provides a generalized dependency between edge orientation and the anisotropic component of the bias displacement vector. The bias magnitude cdb gives the magnitude of the bias, which is more fully expressed by the Dimension Bias Corner Vector (CDB).

Dimension Bias Sample Point Displacement

Figure 28:
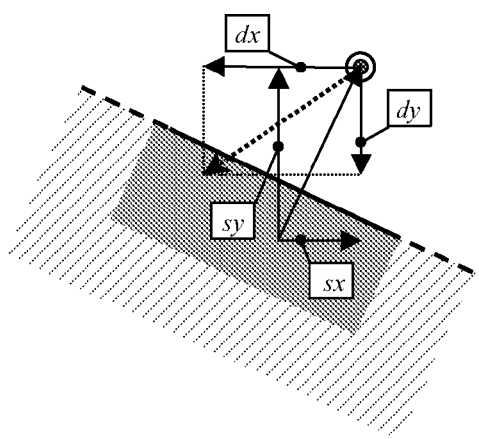
FIG. 28 describes the sampling point displacement using two distinct vector notations.

The description of the sampling point displacement uses two distinct vector notations, shown in FIG. 28. The bias vector (sx, sy), is derived from the pattern intensity surface. The bias vector represents the nominal displacement vector direction and is conceptually normalized to unit length |1|, but can be altered as means of implementation of a figure-of-merit. The sample displacement vector (dx, dy), represents the sample point displacement that corresponds to the bias value set (aib, cdb) and the bias vector.

Note that the sizing vector and bias displacement vector in the general case may have different directions. This is emphasized in the illustration. In a particular embodiment, the nominal direction of the sample displacement vector can be aligned with the bias vector, but the impact of numerical rounding may cause the direction to differ slightly.

Anisotropic Bias Function

In its generalized form, the anisotropic bias function is defined as a function of the orientation of the Bias Vector, (α).

$$\alpha = \arctan(sy/sx) \forall (sy>0, sx>0)$$

The function aib_a(α) is defined by an anisotropic bias map, which is in turn defined by a set of n values subdivided so that aib_a α(α) is defined for angles α={0, 90°·1/(n−1), 90°·2/(n−1), . . . , 90°·(n−1)/(n−1)}. Only one quadrant is defined by the map, and the anisotropic bias function is symmetrically mirrored around each axis, so that $$aib\_a(\alpha) = aib\_a(-\alpha)$$

$$aib\_a(\alpha) = aib\_a(180° - \alpha)$$

In an actual implementation, the function may just as well be defined as a function of the sy/sx quote directly; if aib_a denotes the angle dependent function and aib_a denotes the quote dependent function, the following relations apply:

$$aib\_q(sy/sx) = aib\_a(\arctan(sy/sx))$$

$$dx = sx \cdot \left( \frac{cdb}{2} + \frac{aib\_q(sy/sx)}{2} \right)$$

$$dy = sy \cdot \left( \frac{cdb}{2} + \frac{aib\_q(sy/sx)}{2} \right)$$

Figure 29:
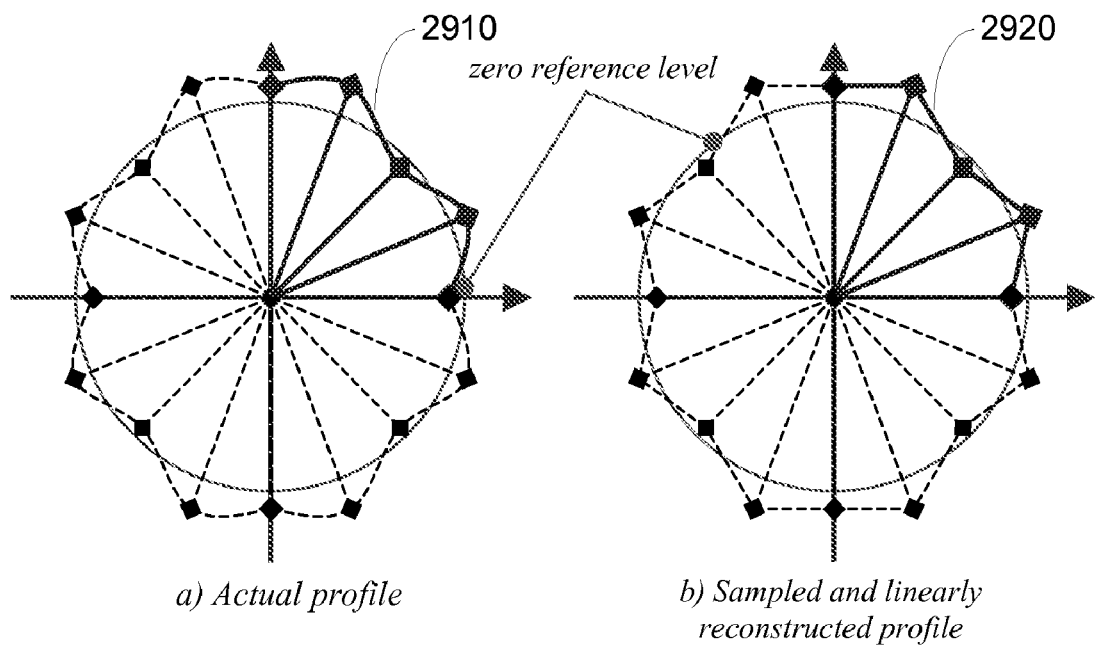
FIG. 29 depicts linear interpolation reconstruction between the AI map values.

The actual aib_a(α) distribution is zero and first order continuous 2910, but linear interpolation reconstruction 2920 between the AI map values can be used as a reference, as depicted in FIG. 29.

Figure 30:
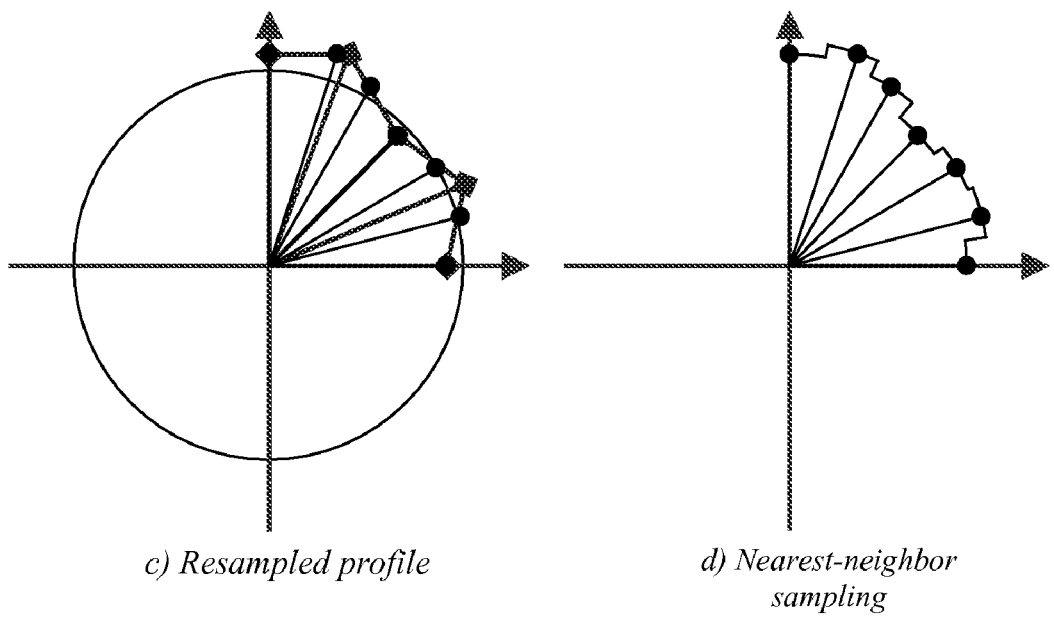
FIG. 30 depicts a re-sampling of the AI function followed by nearest-neighbor reconstruction method.

An actual embodiment of the aib_a( ) or aib_q( ) function may use a re-sampling of the AI function followed by nearest-neighbor reconstruction method, as depicted in FIG. 30. The re-sampling points in figure c) below do not need to be equi-angular.

Bias Vector Field Generation

The bias vector field influences the direction in which sample points should be displaced in order to generate the dimension bias net effect. In most cases, the bias vector field is orthogonal or close to orthogonal to the extension of edges in the source pattern.

A plurality of embodiments of this abstraction can be conceived, but the presently favored method is to analyze the gradient of an area sample intensity surface derived with the integral over a large convolution area size. This strategy both generates a low pass filter effect promoting robustness, as well as extending the range of the field.

The bias vector field as used by the sample point displacer should be normalized in order not to pick up magnitude variations evolving from the gradient generation method. This means that the bias vector field has magnitude of 1 at every point where it is not zero. This makes the bias vector field zero order discontinuous which calls for special attention.

The bias vector field must not be confused with the bias magnitude field, which influences the magnitude of sample point displacement. The bias vector field influences the direction of the sample point displacement.

Altered Bias Vector Magnitude

The bias vector magnitude (typically normalized to unit vector length) can be attenuated in regions where the direction confidence or grid uniformity is low. This could facilitate a graceful degradation for pattern situations resulting in gradients near zero.

In addition, the sizing vector magnitude could be increased to achieve larger displacement at and near corners or short-radius curves. In one embodiment of the Regional Image Displacement framework, the bias vector magnitude is normalized to unit length, and the possibility to promote graceful degradation with this mechanism is not used.

Bias Vector Generation from Corner Extraction

An alternate method of generating bias vectors is to use the result of the corner extraction to create a local bias vector field around each corner point. The reason for doing this is that reconstruction of the bias vector field around corners is influenced by the second order derivates of the source image intensity surface. This influence causes the inherent digitization noise of the source image to be amplified by the nonlinear transformation characteristic exercised at and near corners. By using the noise filtering properties of the corner extraction process, position, orientation and opening angle estimates of the corner, a more noise insensitive bias vector generation can be accomplished. In one embodiment, the bias vector field may be generated by source intensity surface gradient estimation.

Models for the Determination of the S-Field

Idealized Model of Sizing in the Geometry Domain

Figure 42A:
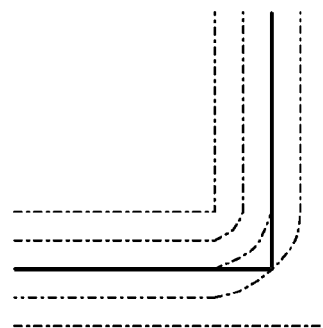
FIG. 42A-B illustrate Iso-level contours resulting from the corner and the idealized vector sizing result.
Figure 42B:
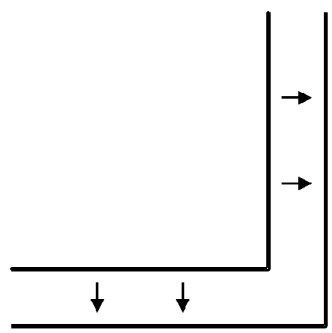

The idealized effect of sizing (in this case symmetrically growing dimensions) is to move the original vectors in their orthogonal direction, as depicted in FIG. 42A-B. Iso-level contours resulting from the corner are shown in FIG. 42A and the idealized vector sizing result in FIG. 42B.

The Sizing Vector Interpreted as the Gradient of the Area Convolution Surface

Figure 43A:
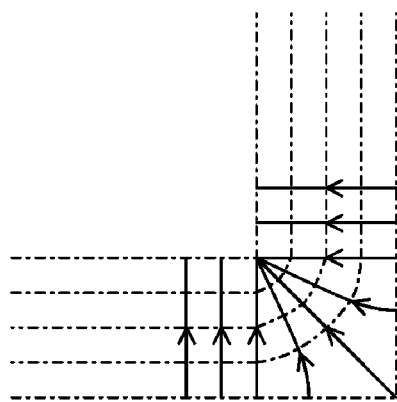
FIG. 43A-B illustrates the shape of the gradient vector field, and demonstrates what the equivalent geometry domain contour would be if the sample points were moved with such a vector.
Figure 43B:
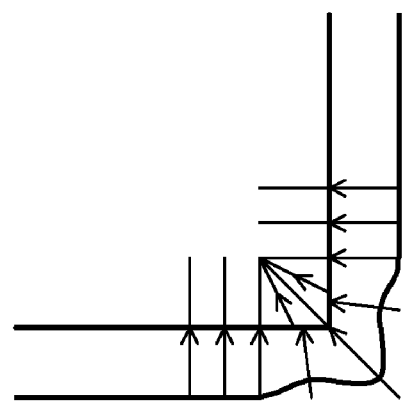

This model, depicted in FIG. 43A-B, is outgoing from the gradient of the area convolution surface at the original, unbiased position of each individual sample point. This gradient is normalized so that $|S|=1$.

Due to the divergence of the gradient vector field that can be observed in corners, the direction will vary with the position relative to the corner. FIG. 43A-B illustrates the shape of the gradient vector field, and demonstrates what the equivalent geometry domain contour would be if the sample points were moved with such a vector. The resulting contour will be different with different CD-values, due to the divergence of the gradient vector field.

The Sizing Vector Interpreted as the Orthogonal of the Iso-Level Contour

Figure 44A:
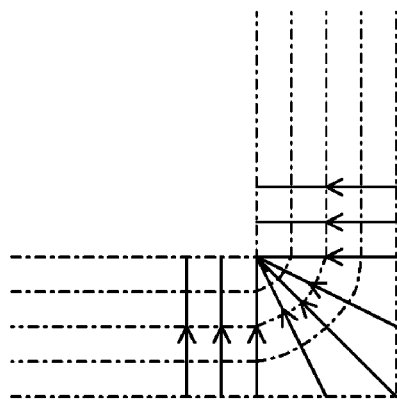
FIG. 44A-B illustrates the shape of the gradient vector field, and demonstrates what the equivalent geometry domain contour would be if the sample points were moved with such a vector.
Figure 44B:
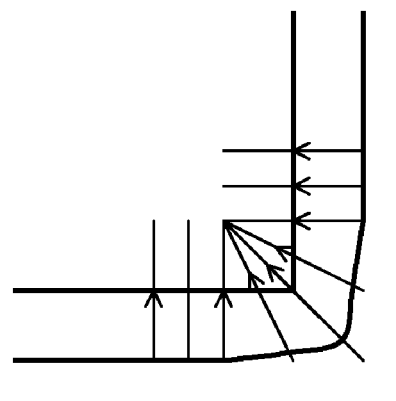

This model, depicted in FIG. 44A-B, is outgoing from the orthogonal direction of the iso-level contour, extended to vector field in the direction of the orthogonal. This field is normalized so that $|S|=1$.

In this case there is no divergence of the vector field observed in corners, and the direction is constant with respect with the position relative to the focal point of the vector field (which is not synonymous with the corner). FIG. 44A-B illustrates the shape of the gradient vector field, and demonstrates what the equivalent geometry domain contour would be if the sample points were moved with such a vector. The resulting contour will be the same with different CD-values.

The Sizing Vector Aligned and Extended from the Corner Bisectrice

Figure 45A:
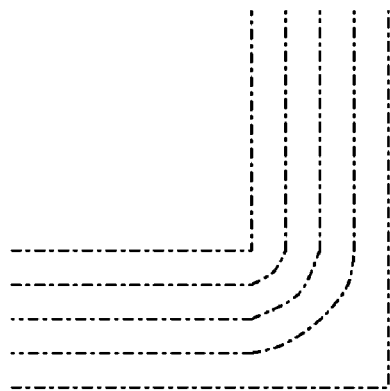
Figure 45B:
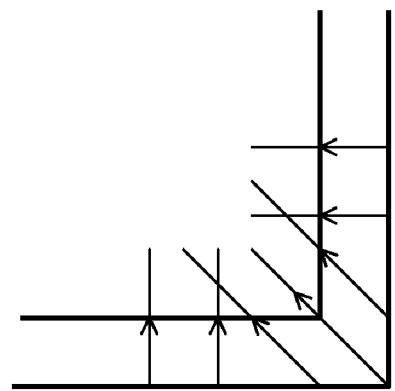

This model, depicted in FIG. 45A-B, is outgoing from the classification of a distinct corner position and the bisectrice angle of that corner. The bisectrice vector is extended into a rhomboidal shaped contour centered around the corner, and the vector field is normalized so the $|S|$ equals the square root of 2.

This gives (at least allegedly) a result that exactly mimics the result of the idealized vector displacement.

Weighted Composite of Bisectrice Interpretation and Gradient

Figure 46A:
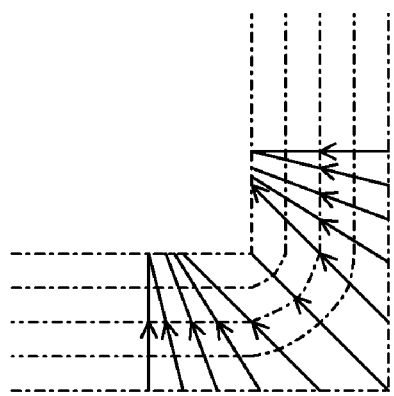
Figure 46B:
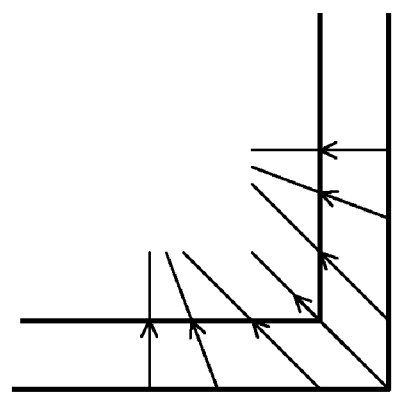

This model, depicted in FIG. 46A-B, is outgoing from a combination of two of the above methods, using the bisectrice vector and gradient vector fields. The weight function should be chosen such that the transition from gradient to bisectrice is smooth.

This may give a result that, depending on the weight function, mimics the result of the idealized vector displacement.

Extension of the S-Field in Proportion to the Bias Range

In order to be able to mimic the behavior of the idealized vector biasing model, the S-field needs to extend in a range corresponding to the extend of the slope of the A-surface plus the range of the biasing. At least two methods of achieving this has been found so far:

Using a Point-Wise Morphological Search Function

To introduce a search function in a discrete sample space, that searches a region for occurrences of gradients, and copies the gradients found in to the point from which the search extends. This can be viewed as an extension of classical binary morphology, but with the addition of copying not only the scalar values of the searched points, but also vector values.

Deriving Gradients from a Larger Area Sample Field

Another way of extending the S-field to match the search range desired is to derive the S-field from an area-sample domain with a larger area convolution extension. For example if the area sample image used for modulation is sampled with 8×8 micro-pixel area sampling, an area sample field from 12×12 micro-pixel sampling will have a gradient field that extends longer.

Corner Radius Control

The methods described above generally expand or reduce a corner feature, including the unintended radius that results from producing a sharp corner with a beam having a Gaussian distribution. Mathematically, resizing a corner feature would be expected to resize the corner radius. Some users prefer for the radius to remain unchanged, despite resizing the corner. To control the corner radius or other features of the corner geometry, additional steps are required. Alternative approaches are described below. One involves superimposing a feature at the corner, as described in prior patent applications naming some of these inventors. Another involves applying corner correction biases.

In overview, corner correction biases can be calculated for a neighborhood by generating resized features in two ways and comparing the result. One resizing is performed in the vector domain and then rasterized. The resizing begins with rasterizing and then applies resizing in the raster domain. The corner correction bias is the difference between the two. That is, the corner correction bias added to the resizing performed in the raster domain replicates the intensity values generated when a feature is resized in the vector domain before rasterization.

Corner correction biases conceptually are applied by matching the position of a corner in an area to a larger corner correction bias neighborhood. Suppose the corner is somewhere in an 120×120 um area. Then, a corner correction bias neighborhood of 240×240 um might be used, with the corner point in the center of the neighborhood. The position and orientation of the corner within its original area is determined and fit to the correction data. Practically speaking, a faster alternative is to determine a variety of corner positions and orientations and use them as indicies to a table that includes parts of the larger corner correction bias neighborhood. Then, bias data can be applied efficiently.

One method of generating Bias Vectors is to use the result of the corner extraction to create a local bias vector field around each corner point. The reason for doing this is that reconstruction of the bias vector field around corners is influenced by the second order derivates of the source image intensity surface. This influence causes the inherent digitization noise of the source image to be amplified by the non-linear transformation characteristic exercised at and near corners. By using the noise filtering properties of the Corner Extraction process, position, orientation and opening angle estimates of the corner, a more noise insensitive bias vector generation can be accomplished.

Corner Enhancement

Figure 47:
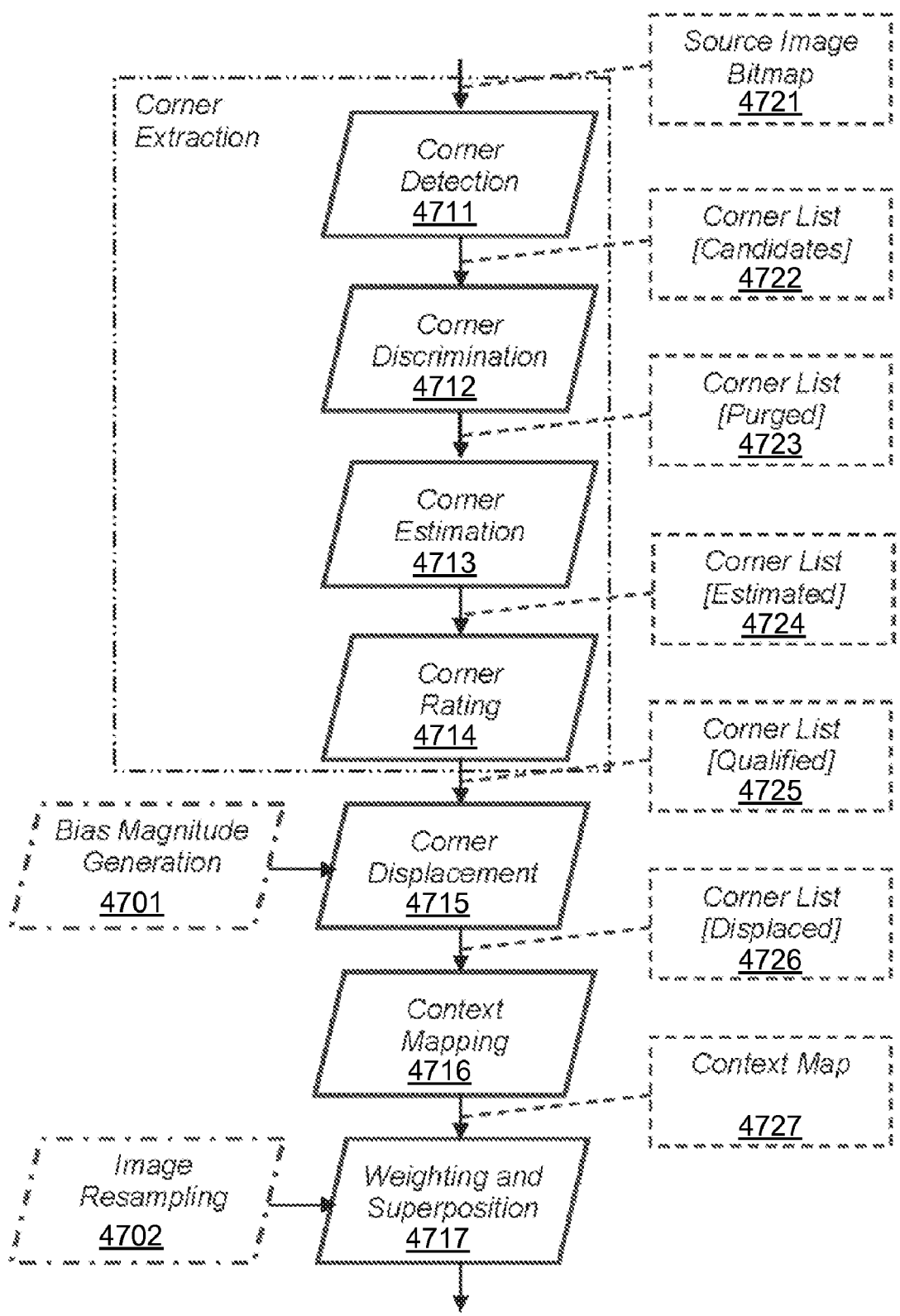
FIG. 47 is a high level diagram of corner extraction and enhancement.

Corner Enhancement is achieved by a series of operations depicted in FIG. 47, ranging from mapping of corners in the source image to altering of the output image. In the following descriptions the term 'Corner' is consequently used to describe a 'Corner Point', a point with an infinitely small spatial extension representing the cross section of two straight line segments of the underlying source pattern.

A central element in the corner enhancement processes is the Corner Descriptor, which represents the position and attributes of a corner point. The Corner Descriptors can be aggregated in to Corner Lists, to represent a larger surface. The Corner Descriptor has the following attributes:

| Attribute | Description |
| --- | --- |
| Coordinate X | Defined as the X-axis coordinate of the line segment cross point |
| Coordinate Y | Defined as the Y-axis coordinate of the line segment cross point |
| Opening Angle | Defined as the angle between the line segments measured over the sector with the higher intensity. An 'inner' corner hence has an opening angle of 360° − γ, if γ is the corresponding 'outer' corner opening angle. |
| Orientation Angle | Defined as the orientation of the bisector of the corner, the bisector being a third line segment crossing the cross point dividing the opening angle of the corner in two identical halves. |
| Figure Of Merit | Defined as a value ranging from 0% to 100% describing the validity of the corner report, where 0% is a completely invalid report and 100% is a report with 100% validity. |

Corner Extraction

Corner Extraction is a collective term used for the processes generating a Qualified Corner List 4725. A Qualified Corner List is a corner list with valid corners, without duplicate or false occurrences, each with a figure-of-merit rating and estimations of position, opening angle and orientation. The abstraction Corner Extraction is used for bundling four processes; Corner Detection 4711, Corner Discrimination 4712, Corner Estimation 4713 and Corner Rating 4714. This bundling shows that a Corner Extraction process does not necessarily have to include a Detector, a Discriminator and a Rater.

Figure 48:
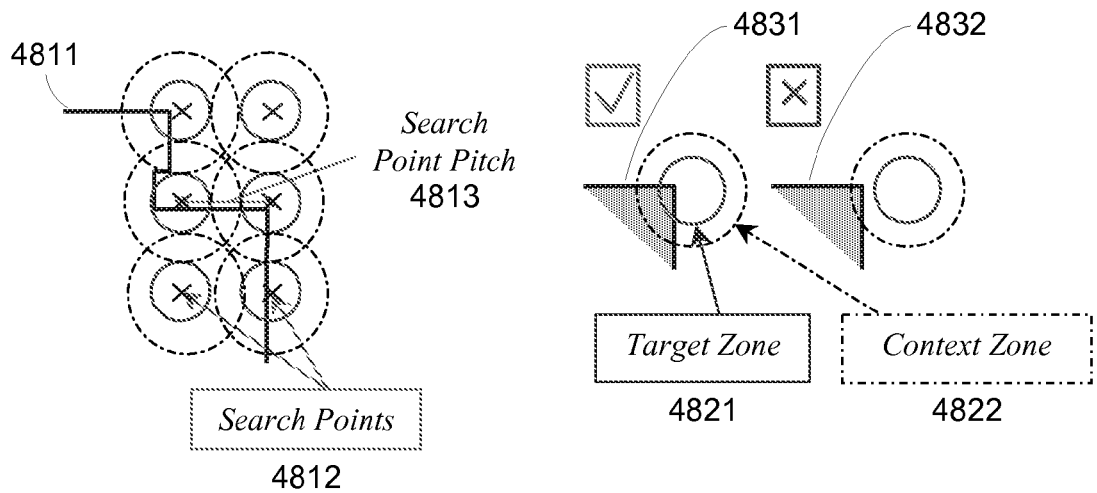
FIGS. 48-49 illustrate corner extractor issues.

Corner extractors described here and illustrated by FIG. 48 are based on the concept of corner search within a confined region centered round a Search Point 4812, finding and estimating corners 4811, 4831, 4832 within a certain Target Zone 4821 using a Context Zone 4822.

Corner extraction is characterized by a set of properties that guide both implementation and performance levels. These are: Search Point Resolution, which is the pitch between search points operations. Target Zone, which is the region around a search point within which corners are detected. Context Zone, which is the region evaluated to find corners in the target range. Context Resolution, which is the spatial resolution in which the context region is resolved. And, Context Precision, which is the dynamic resolution with which the context is represented. These corner extractor characteristics are interrelated. The search point resolution and target range have to be correlated in order to cover all positions to assure coverage. The target ranges may overlap, as may the context ranges. One criterion for context range selection is to prevent degradation of the Corner Extraction process at or near complex pattern situations. Examples of such situations are when other paths or other corners of the same path occur within the context range.

Figure 49:
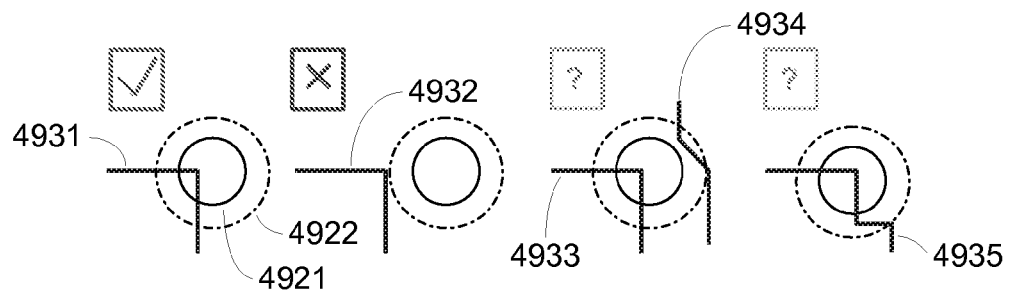

FIG. 49 illustrates how adjacent paths 4933, 4934 or corners 4935 can confound the Corner Extraction processes. The uncertainty in these cases can yield two effects: Complete failure to detect the corner; or detection of corner with faulty estimations of position, orientation or opening angle. The first effect is, due its inherent non-linear behavior, subject to grid variations from digitization errors. This results in deteriorated grid uniformity, where a particular corner may or may not be detected, depending on the grid position. The architecture may be augmented to counteract these negative effects, at the cost of accuracy and spatial resolution.

It is therefore beneficial to minimize the range of the context zone 4822. This in turn reduces the precision of the result, since (under constant resolution) less information is available for detection and estimation. The Context Zone 4822, of course, can not be smaller than the target zone 4821. The Context Precision and Context Resolution determine the precision of the result. The two properties are interchangeable by means of using different scale-space levels, and increasing resolution corresponds to decreasing precision.

Corner Detection

Corner Detection is the process of generating a Corner Candidate List 4722 from evaluation of one or more source image 4721 derivatives. Source image derivatives may include multiple scale-space samplings, multiple convolutions and thresholded images. More than one detection process 4711 can operate in parallel on one Target Zone.

A Corner Detector 4711 can be dedicated to a particular interval of orientation and opening angle, in which case each reported corner implicitly defines these angle intervals. The Corner Detector implicitly reports a coarse position estimate since the position is limited to the Target Zone. All corner detectors are anticipated to have a behavior such that certain orientation and opening permutations are always reported, some are never reported and yet some are reported or not, depending on grid position.

Corner Detection in an intensity surface can be implemented in a large variety of ways. The Regional Image Displacement framework can utilize intensity surface iso-level curve crossing pattern matching and/or intensity surface derivate zero-crossing pattern matching. Corner detection is not limited to these methods and implementations of the framework can benefit from other detection methods that they can use a sparsely sampled intensity surface as input, generating a list of corner points or corner point candidates.

Intensity Surface Iso-Level Curve Crossing Pattern Matching

Figure 50:
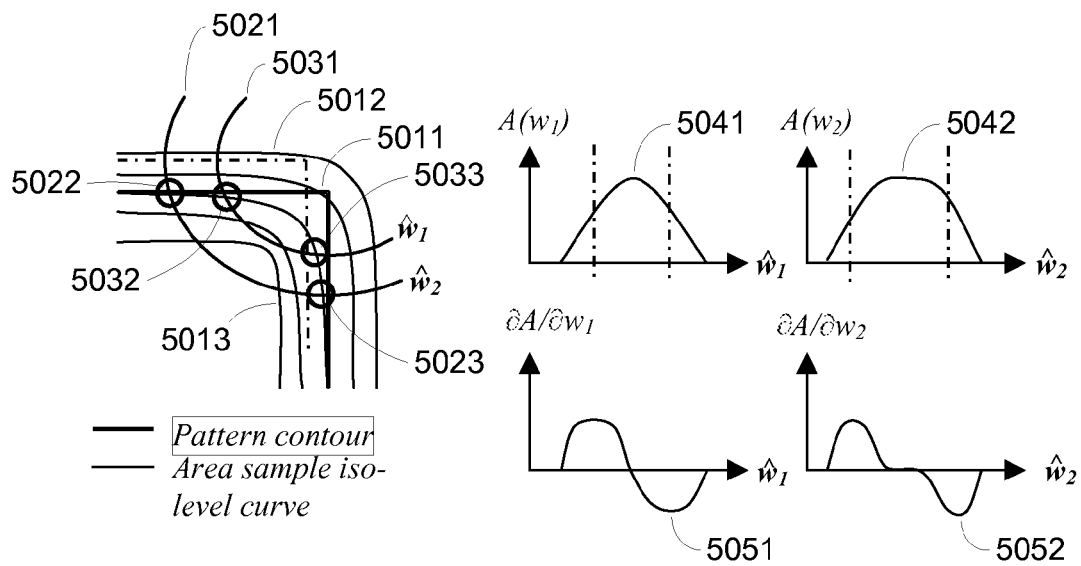
FIG. 50 depicts a method based on the presence of multiple search paths which may be closed or open, along which variations of the intensity surface values are characterized and correlated.
Figure 51:
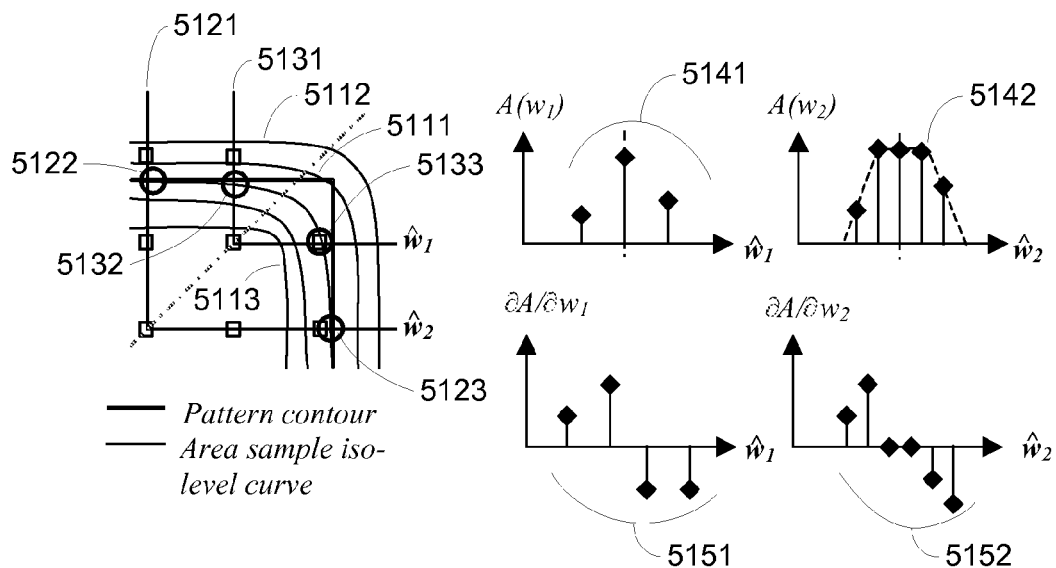
FIG. 51 depicts an approximation to replace the paths $w_1$ and $w_2$ with square paths aligned with the sample grid.

A method depicted in FIG. 50 is based on the presence of multiple search paths 5021, 5031, which may be closed or open, along which variations of the Intensity Surface values 5013 are characterized 5141-42, 5151-52 and correlated 5022-23, 5032-33. Actual implementations can benefit from radical approximations. One such approximation, depicted in FIG. 51, is to replace the paths $w_1$ and $w_2$ with square paths 5121, 5131, aligned with the sample grid. Another approximation is to implement the characterization of derivate sign changes 5152 and maxima 5142 as the identification of the shift from '1' to '0' in the Intensity Surface Value.

Intensity Surface Derivate Zero-Crossing Pattern Matching

Figure 52:
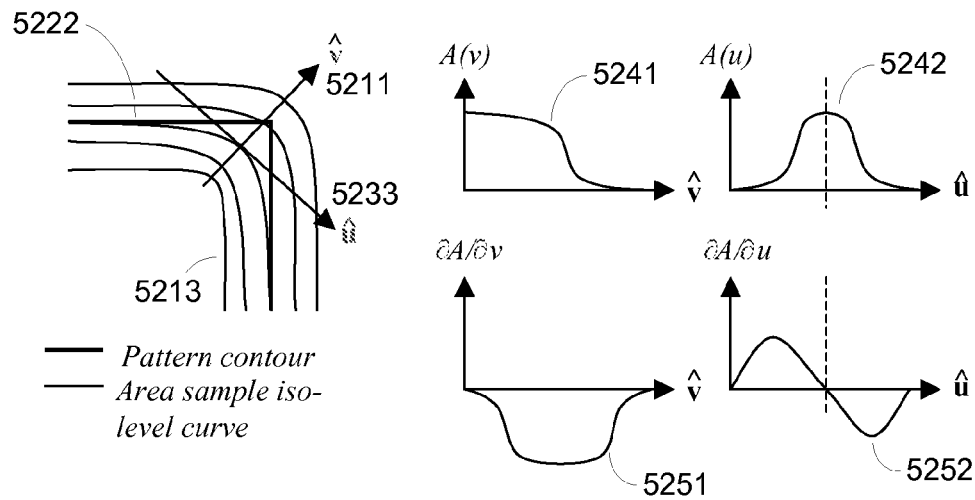
FIG. 52 illustrates a method using a mathematical definition of curvature based on analysis of first and second order derivates using a coordinate system aligned with the direction of the gradient.

This method, illustrated in FIG. 52, uses a mathematical definition of curvature based on analysis of first and second order derivates using a coordinate system aligned with the direction of the gradient. The method is thus only valid at points where the gradient is non-zero.

The method in its unrefined form pre-assumes a method of performing partial differentials along a coordinate system that is, in the general case, not aligned with the sample grid. This makes the method, in its unrefined form, less useful other than for corner orientations aligned with the axis.

Corner Discrimination

Corner Discrimination 4712 is the process of eliminating duplicate or inadvertently reported corners. The result is a Purged Corner List 4723. This is only necessary if the corner detector array has a tendency of reporting multiple or false corners. This is the case when the Target Zones of the corner detectors overlap, or if digitization noise impact makes the corner detection condition being fulfilled at multiple locations.

The rules of discrimination have to be tailored to match the detector(s). Example of a discrimination criterion is topologically impossible corner reports such as two corners of the similar orientation aligned so that an impossibly sharp turn would be required to describe the connecting path. The definition of impossibility can be deduced from the spatial frequency content of the area sample image.

Corner Estimation

Figure 53:
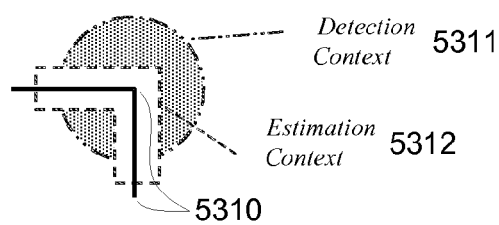
FIG. 53 illustrates Corner Estimation of attributes such as position, orientation and angle outgoing from the data generated by the Corner Detection processes.
Figure 54:
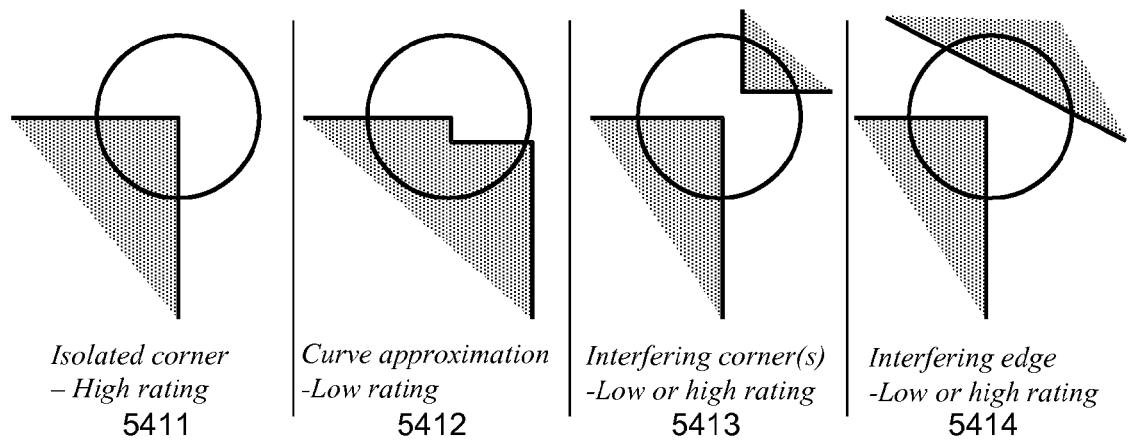
FIG. 54 illustrates three types of topological complexity.

Corner Estimation 4713 is the process of estimating corner attributes such as position, orientation and angle outgoing from the data generated by the Corner Detection process(-es). In using image data located around anticipated edge extensions is useful for Corner Estimation. This sifting can be viewed as an adaptation of the Context Zone (5311, 5312 in FIG. 53), excluding parts of the zone that are not relevant for the sifting operation.

Corner Rating

Corner Rating 4714 is the process of down rating the corners in order to achieve a smooth degradation of corner enhancement when the topological complexity arises and full corner enhancement based on an uncertain corner report would cause anomalies or deteriorated pattern fidelity. This downgrading also promotes better grid uniformity by limiting the impact of grid dependent digitization noise. Corners are rated on a scale of 0 to 1, where 1 represents an isolated corner 5411 where full corner enhancement is applied and 0 represents a corner completely downgraded, so that it in practice is treated like a non-corner.

Three distinct types of topological complexity are identified: Corner-to-Corner Gap Interference 5413, which occurs when two corners, belonging to different topological paths and being in close proximity to each other, interfere. Corner-to-Edge Gap Interference 5414, which occurs when a corner interferes with an edge of a different topological path. And, Curve Approximation 5412, which occurs when two corners of one and the same topological path is so close so that the result in aerial image approximates a curve rather than a line segment between two distinct corners.

The Curve Approximation 5412 case is best handled by Corner Rating, whereas the Corner-to-Corner Gap Interference 5413 is better handled by another mechanism.

The Corner Rating process can benefit from an Adopted Context Zone similar to the one proposed for Corner Estimation.

Corner Displacement

Corner Displacement 4715 is the process of altering the corner coordinates of elements in the Corner List in accordance to the Bias Magnitude 4701 reported by the Bias Magnitude Field Generator and the Anisotropic Bias Map. The displacement can be expressed as a Corner Point Displacement Vector superimposed on the Corner Coordinate. The magnitude is proportional to, but not necessarily equal to, the Bias Magnitude. The Magnitude is also affected by the Anisotropic Bias Map. The direction is proportional to, but not necessarily equal to, the Corner Orientation. The direction is also affected by the Anisotropic Bias Map.

The relation between Bias Magnitude, Anisotropic Bias Map and Corner Point Displacement Vector is depending on the exact definition of the physical behavior, which may vary over time (either actual behavior or its definition). A generalization of these relations is therefore introduced in the architecture.

The following definitions apply to the generalized corner displacement function:

| Term | Definition |
| --- | --- |
| Corner Orientation [α] | The orientation of the corner bisector reported by the extraction process |
| Corner Opening Angle [γ] | The opening angle of the corner reported by the extraction process |
| Edge orthogonal orientations [β] | The orientations of the orthogonal to the edges at each side of the corner |
| Anisotropic Bias Function [aib(β)] | The generalized dependency between edge orientation and the anisotropic component of the bias displacement vector |
| Bias Magnitude [cdb] | The magnitude of the isotropic bias sampled in the position of the Corner Coordinate. |
| Dimension Bias Corner Displacement Vector [$C_{DB}$] | The corner displacement vector for aggregate Dimension Bias (Anisotropic and CD in combination) |
| Anisotropic Bias Corner [$C_{AI}$] | The corner displacement vector for Anisotropic Bias |
| CD Bias Corner Displacement Vector [$C_{CD}$] | The corner displacement vector for CD Bias |

Figure 55:
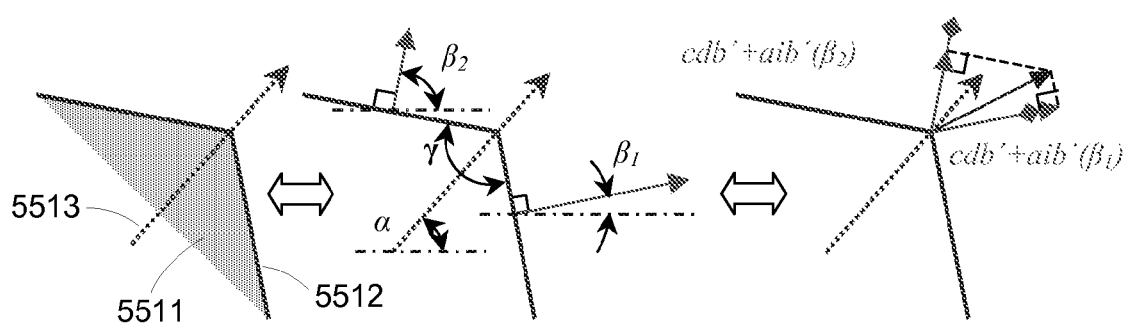
FIG. 55 illustrates Corner Displacement Vectors.

The Corner Displacement Vectors $C_{DB}$, which are illustrated in FIG. 55, depend on corner orientation α, corner opening angle γ, CD Bias magnitude cdb and the two anisotropic bias magnitudes aib(β).

(cdb) is a dimension metrics and (aib) is a relative dimension metric. These relate to edge point displacement metrics (cdb') and (aib') according to the following relation:

$$cdb' = cdb/2$$

$$aib'(\beta) = \frac{aib(\beta)}{4}$$

From FIG. 55, we can see that the β angles depend directly on α and γ, but are independent of cdb and aib(β). The included area of the corner 5511 is bounded by edges 5512 and can be bisected 5513. The bisector and angles between the grid axes and the edges are used in the geometric construction.

$$\beta_1 = \alpha + \gamma/2 - 90°$$

$$\beta_2 = \alpha - \gamma/2 + 90°$$

The aggregate contribution to the Dimension Bias Corner Displacement vector $C_{DB}$ can be decomposed in accordance with FIG. 56A-B.

$$\overline{C}_{DB} = \overline{C}_{AI} + \overline{C}_{CD}$$

The purpose of the decomposition is to section the aggregate operation into subparts with fewer variables. This decomposition is useful from an implementation point of view, since functions with fewer variables better lend themselves for approximations.

The isotropic CD bias component CCD can be derived from cdb' and values of α and γ:

$$\overline{C}_{CD} = (\hat{x} \cdot \cos(\alpha) + \hat{y} \cdot \sin(\alpha)) \cdot \left(\frac{cdb'}{\cos(\gamma/2)}\right)$$

The anisotropic bias component can be derived from the aib'( ) function and values of α and γ using the relations shown in FIG. 57. The anisotropic bias component $C_{AI}$ is deduced by calculating the intersection point between two vectors orthogonal to the anisotropic edge displacement vectors, and substituting β angles with α and γ angles.

$$\overline{C}_{AI} = \frac{1}{\sin(\lambda)} \cdot \left( \begin{array}{l} \hat{x} \cdot \left[ \begin{array}{l} \cos(\alpha + \gamma/2) aib(\alpha - \gamma/2 + 90°) + \\ \cos(\alpha - \gamma/2) aib(\alpha + \gamma/2 - 90°) \end{array} \right] + \\ \hat{y} \cdot \left[ \begin{array}{l} \sin(\alpha + \gamma/2) aib'(\alpha - \gamma/2 + 90°) - \\ \sin(\gamma/2 - \alpha) aib'(\alpha + \gamma/2 - 90°) \end{array} \right] \end{array} \right)$$

A useful and adjustable generalization of the above expressions for the isotropic and anisotropic bias function can be formulated when the aggregate $C_{DB}$ vector is treated as a two generalized functions of α and γ. The aib( ) function, being spatially and temporally invariant, can be viewed as inherent in one of the generalized functions.

$\overline{C}_{CD} = cdb \cdot \overline{F}_{CD}(\gamma, \alpha)$ $\overline{C}_{AI} = \overline{F}_{AI}(\gamma, \alpha)$ $\overline{C}_{DB} = cdb \cdot \overline{F}_{CD}(\gamma, \alpha) + \overline{F}_{AI}(\gamma, \alpha)$ With limited precision requirements for $C_{DB}$ and limited resolution of α and γ, the functions $F_{CD}$ and $F_{AI}$ can be implemented with a simple interpolation between discrete values (in the simplest case nearest neighbor interpolation). In order to facilitate tuning of these functions to match changing physical models, the mathematical expressions of F functions may change and is not allowed to fundamentally impact implementation architecture.

Corner Context Mapping

The Context Mapping provides means of determining a corner neighborhood for analysis of interference between multiple pseudo-features and between pseudo-features and pattern edges.

The Context Mapping process can be decomposed in three steps: Selecting a relevant neighborhood of interaction outgoing from the position of the sample point coordinate. All corner objects that could possibly affect the output sample are included. Then, sorting elements in this neighborhood according to an impact estimate. Such an impact estimate could be Euclidian distance, potentially in combination with orientation. And, discrimination of all elements but the (n) closest or high-impacting. The result of the Context Mapping process is stream of Corner Sets, each Corner Set being the result of a separate Context Mapping, expressed in the form of a short Corner List. The Corner Set can conceivably be empty, if no corners are left after process step (1). No Corner Set will have more than (n) elements.

Generating Corner Bias Tables

Corner Bias Tuning (CBT) uses corner information from the corner extractor and then a mechanism similar to corner enhancement superposition to alter the pixel data near corners. By calculating the difference between a dense sampled image with a Manhattan outer corner obtained with IFR and a dense sampled image obtained with a Matlab program that resizes data in the vector domain and then rasterizes it. With the gradient based biasing method, we get a dense sampled image showing the error the biasing causes for the outer corner. By letting this dense sampled error image have a size, for instance, of 96*96 samples with a pitch of 4 SP128 we can then add bias data from the distribution to the image. As the dense sampled difference images depend on the value of the bias parameter, tables are pre-calculated for a variety of bias parameter values. Either a nearest neighbor value or interpolated value could be used from the tables.

Dense Sampled Images

Dense sampled images are calculated with IFR and with Matlab for bias parameter values. In Matlab calculations, an ideal renderer has been used for the area sample image that is the input to DVG. We also use an ideal resampler to get rid of rendering errors and reconstructor errors.

A difference image is calculated as the difference between the dense IFR image and the dense Matlab-calculated image. The test pattern used in the image contains both an outer and an inner corner. The regions around those corners are cut out to from one dense sampled difference image for the outer corner and one for the inner corner. The dense sampled images are the adjusted so the pitch becomes 4 SP128 and the size 96*96 pixels. Currently, the dense images are calculated using 128 by 128 grid positions. It results in a denser sampled difference image than may be required for the distributions. Each sample in the 96*96 output distribution is then obtained by calculating the average of the 4*4 neighborhood in the high resolution dense sampled difference image.

Since the CBTD are supposed to be symmetrical, as is the CEF distributions, the final distribution is calculated by folding it along the diagonal and calculate the mean (i.e. CBTD= (CBTD+CBTD')/2.

Corner Pseudo-Feature Superposition

The Corner Pseudo-feature Superposition process implements the combination of two pattern layers:
1) The original, un-enhanced image layer, re-sampled according to Dimension Bias and Distortion Compensation impact on Sample Point Displacement
2) The Pseudo-feature image layer, composed of pseudo-feature intensity surface distributions superimposed onto one intermediate image layer.

The two layers have the same resolution, represented with equidistant rectangular grids, and the superposition is a scalar addition of two corresponding samples from each of the distributions.

The resulting image $A'(C_i)$ in turn fed through to a limiting operation that results in value $A''(C_i)$ between 1 and 0.

$$A''(\overline{C}_i) = \begin{cases} A'(\overline{C}_i) \forall |A'| \leq 1 \\ 1 \ \forall \ A' > 1 \\ 0 \ \forall \ A' < 0 \end{cases}$$

The Pseudo-feature superposition process generating $P(C_i)$ represents, for every sample point a linear addition of contributions $E(D_{ij})$, where $D_{ij}$ is the difference vector between the sample point coordinate $C_i$ and the corner coordinate $C_j$. Either, or both, of $A(C_i)$ and $P(C_i)$ is subject to down-weighting prior to the above superposition in order to compensate for proximity effects.

FPGA and Block Implementation of One Embodiment

Figure 31:
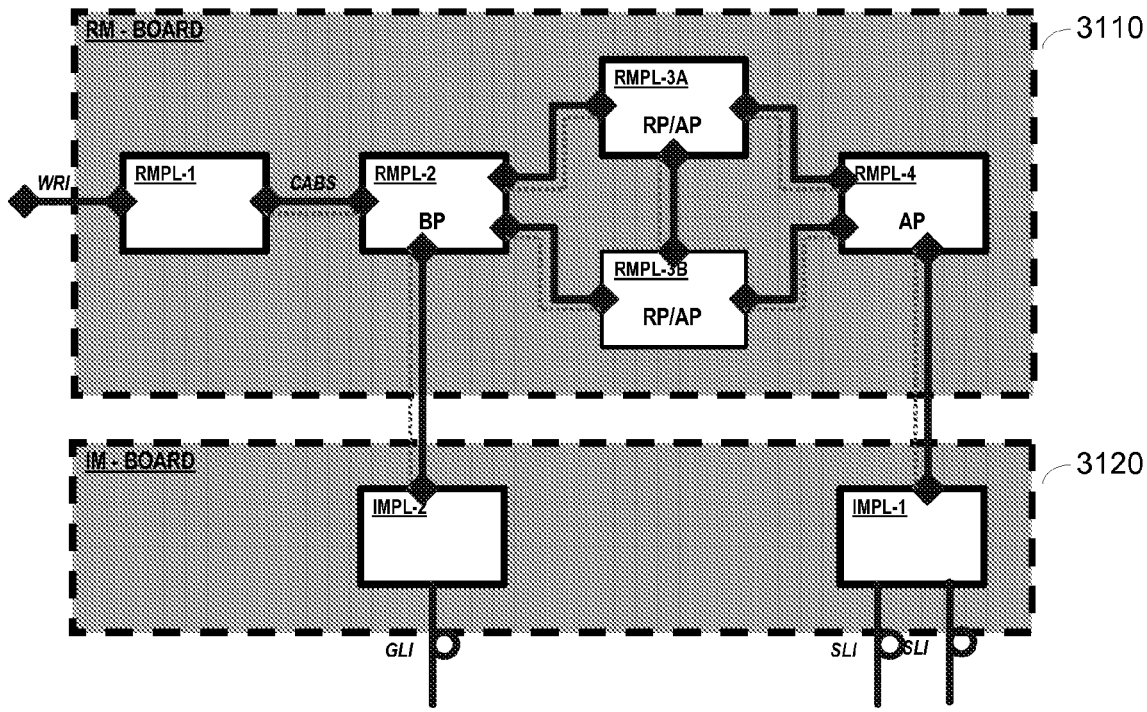
FIGS. 31-35 drill down through one FPGA embodiment to a block diagram of implementation logic.

FIGS. 31-35 drill down through one FPGA embodiment to a block diagram of implementation logic. FIG. 31 shows a board-level interrelationship among one or more rendering module boards 3110 and interface module boards 3120. Five FPGAs are depicted as seated on the rendering module board, though this number and the allocation of FPGA real estate will change as the characteristics of available FGPAs change with time. Of course, other logic devices such as semi-custom or custom ASICs or gate arrays can readily be substituted for FPGAs. Two FPGA are depicted as seated on the interface module board.

Figure 32:
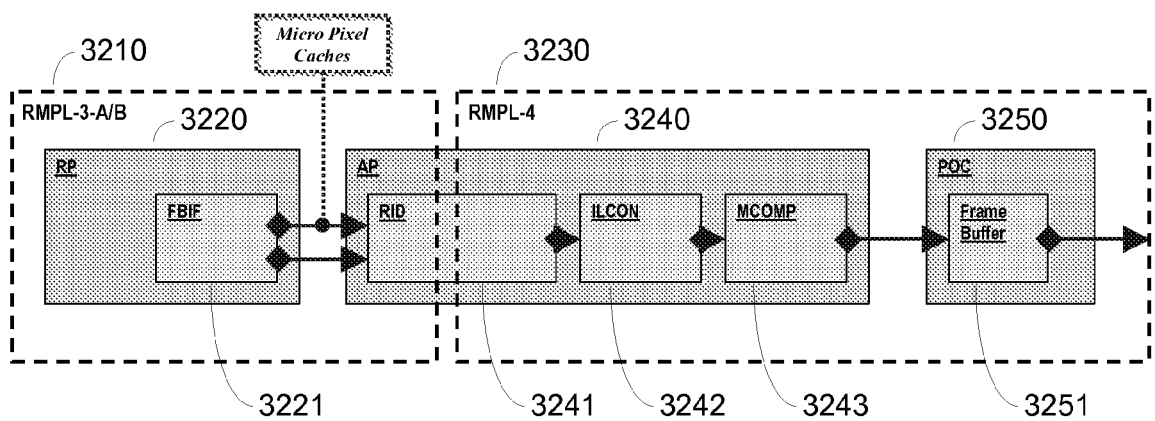

FIG. 32 is a high-level block diagram of functional allocation of logic blocks across FPGAs. A rendering process subsystem (RP) 3220 is implemented in right and left halves in RMPL-3-A/B 3210. The regional image displacement (RID) block 3241 of the adjustment processor subsystem (AP) is spread over three FPGAs, split between right and left halves of RMPL-3-A/B 3210 and also on RMPL-4 3230. The adjustment processor 3240 is part of a process chain that may include bin sorting of geometries, rendering and area sampling, pattern manipulations and domain conversions. The input and the output data of the RID are pixel data or area samples. The image may be transferred from the FBIF 3221 to the RID subsystem 3241 line wise in an interleaved fashion. Illumination compensation (ILCON) 3242 and mirror compensation (MCOMP) 3243 blocks of the adjustment processor are implemented on RMPL-4 3230, as is the pixel output controller (POC) 3251.

Figure 33:
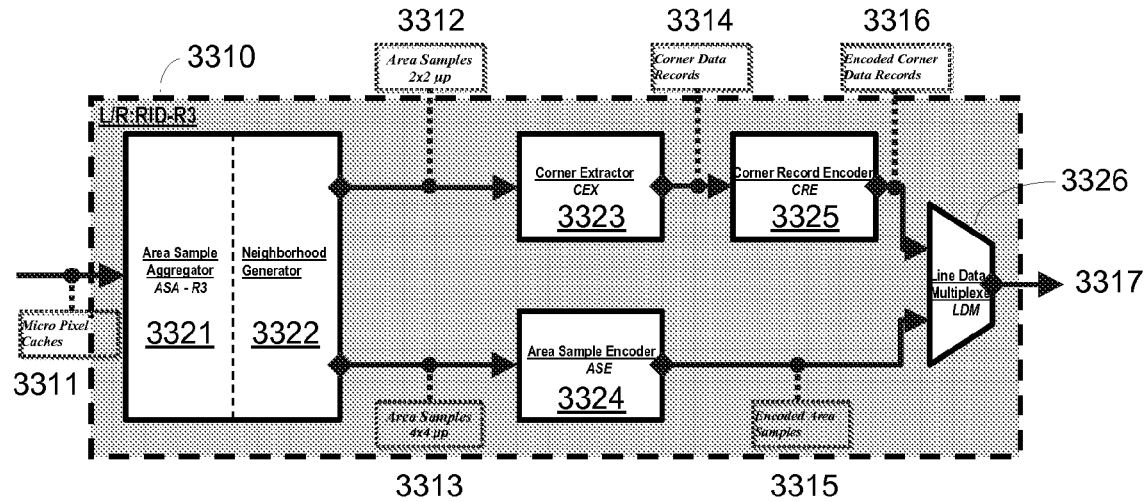

FIG. 33 is a high level block diagram of RID components replicated in the left and right halves of RMPL-3-A/B 3210. The RID components on these FPGAs are used to extract and compact data structures derived from the raster data provided by the rendering processor. Five RID blocks include the area sample aggregator 3321, area sample encoder 3324, corner extractor 3323, corner data encoder 3325 and line data multiplexer 3326. The area sample aggregator 3321 receives data 3311 from the micropixel cache. The sampling pitch for use by the corner extractor is 2 um 3312 and the sampling pitch for the area sample encoder is 4 um 3313. Data from the micropixel cache 3311 preferably is on an equidistance and orthogonal sampling grid. This results in area samples that are equidistant, abutting and non-overlapping. Alternatively, circular area samples might be used to correspond to a Gaussian distribution of light projected from a micromirror, which most likely would be overlapping. The area sample encoder 3324 provides aggregation and buffers for multiple lines of information. It participates in flow control by generating request events. The corner extractor (CEX) 3323 is a generic term used to bundle processes of corner detection, corner discrimination, corner estimation and corner rating. The purpose of the CEX 3323 is to generate a qualified corner list. The corner detection (DET) process detects up to 16 possible corner candidates within the incoming data neighborhood. The corner discriminator (DISCR) removes erroneously detected corners by applying a set of rules to create a purged corner list, with a maximum of 4 corner candidates. The corner estimation (EST) and rating create a more precise corner position estimate, as well as a figure of merit for the candidates. The estimated corner candidates and the figures of merit are merged (MRG) into a set of corner data records 3314. Data fields in a corner data record may include Existence (1 bit), Figure Of Merit (4 bits), Corner Position Y (6 bits), Corner Position X (6 bits), Corner Orientation (2 bits) and Corner Polarity (1 bit). In sequence, the corner extractor process begins with area samples of pitch AS2, from which the corner detection process produces a list of candidate corners. The corner discrimination process purges some of the candidate corners, producing a purged corner list. The corner estimation process and corner rating produce a qualified corner list. The corner record encoder (CRE) 3325 is used to encode the corner data records produced by the CEX into a CABS efficient format 3316. It can store multiple lines of information may receive one line while another is transmitted. The purpose of the line data multiplexer 3326 is to time multiplex encoded area samples 3315 and encoded corner data records 3316 line packets for transmission 3317 over CABS.

Figure 34:
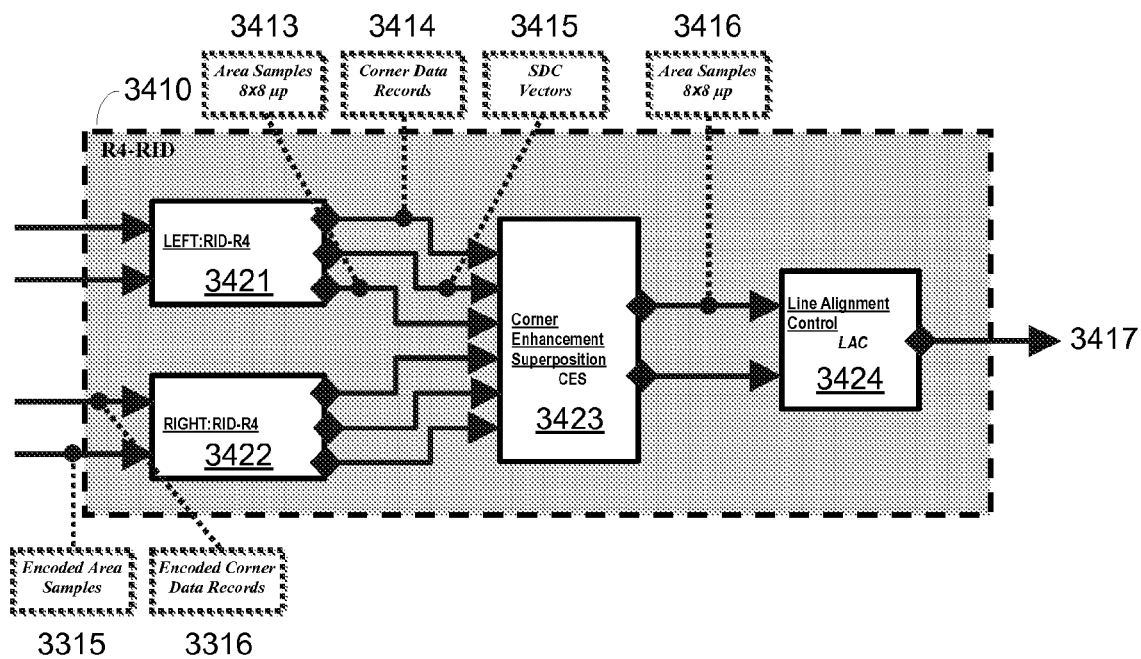
Figure 35:
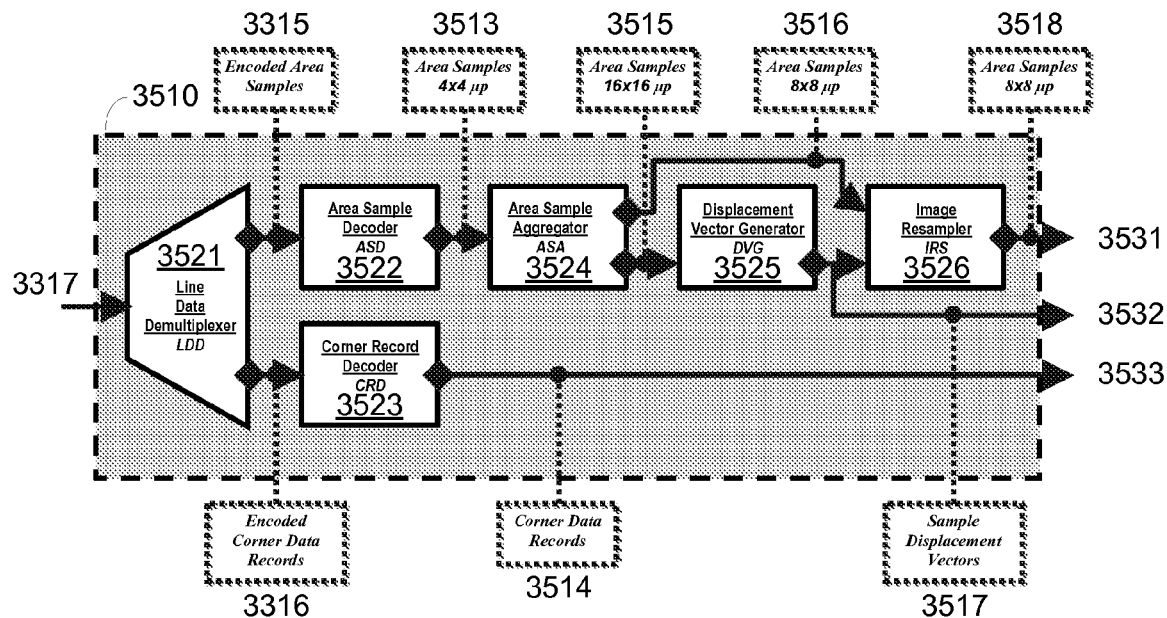

FIG. 34 is a high level block diagram of RID components resident in RMPL-4 3410, which processes data from the left and right halves of RMPL-3-A/B 3421, 3422. The RID components on this FPGA handle pattern manipulation or digital image warping, including as logic blocks a Line Data Demultiplexer—LDD 3521, Area Sample Decoder—ASD 3522, Area Sample Aggregator—ASA 3524, Distortion Vector Generator—DVG 3325, Image Resampler—IRS 3326 and Corner Record Decoder—CRD 3323. FIG. 35 provides additional detail of these blocks. The purpose of the Line Data De-Multiplexer 3321 is to send Encoded Area Samples (EAS) 3315 and Encoded Corner Data Records 3316 line packets to the ASD 3522 and CRD 3523 blocks. It is also a part of the flow control mechanism by issuing line request events. The purpose of the area sample decoder 3522 is to unpack 17 bit blocks from the incoming 32 bit stream and to decode it into a 20 bit stream of 4 um area samples 3513. The ASD 3522 has a buffer capable of storing multiple lines of information.

Figure 36:
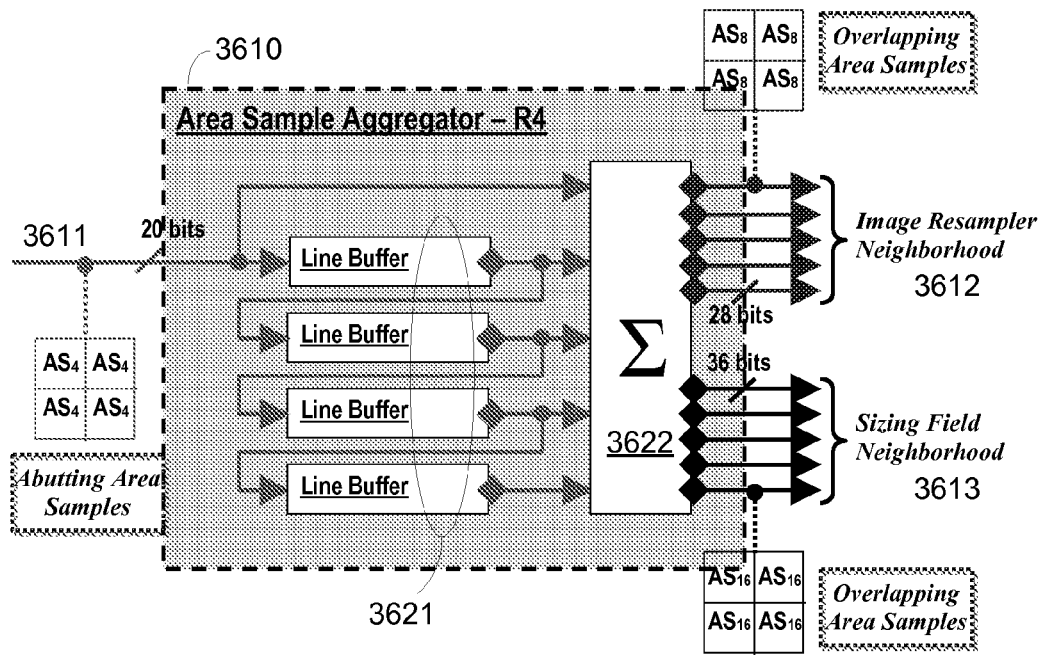
FIG. 36 illustrates an area sample aggregator (ASA).

The area sample aggregator (ASA) 3610 is depicted in FIG. 36. The input data 3611 is abutting area samples. Line buffers 3621 support summation 3622 and resampling of the abutting samples. The output data streams to the image resampler 3612 and distortion vector generator 3613 are equidistant and overlapping area samples. The area sample aggregator 3610 provides the image resampler 3526 with samples having a pitch of 8 um 3516 and the displacement vector generator 3525 with samples having a pitch of 16 um 3515.

Figure 37:
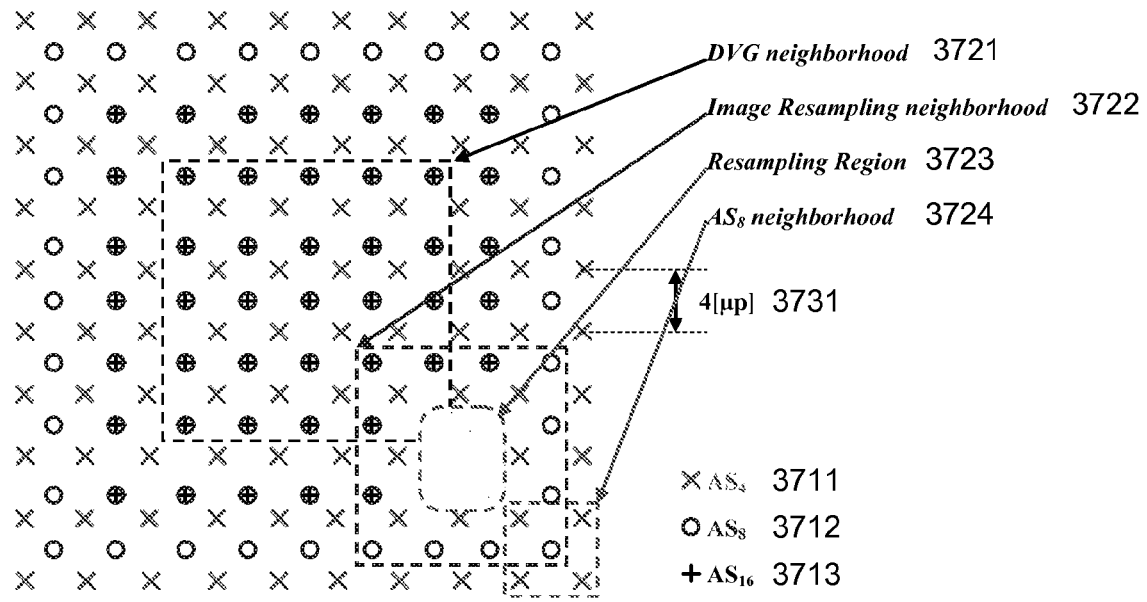
FIG. 37 depicts various neighborhoods of varying pitches on a grid.

FIG. 37 depicts various neighborhoods 3721-3724 of varying pitches 3711-3713, on a grid having a certain pitch 3731.

Figure 38:
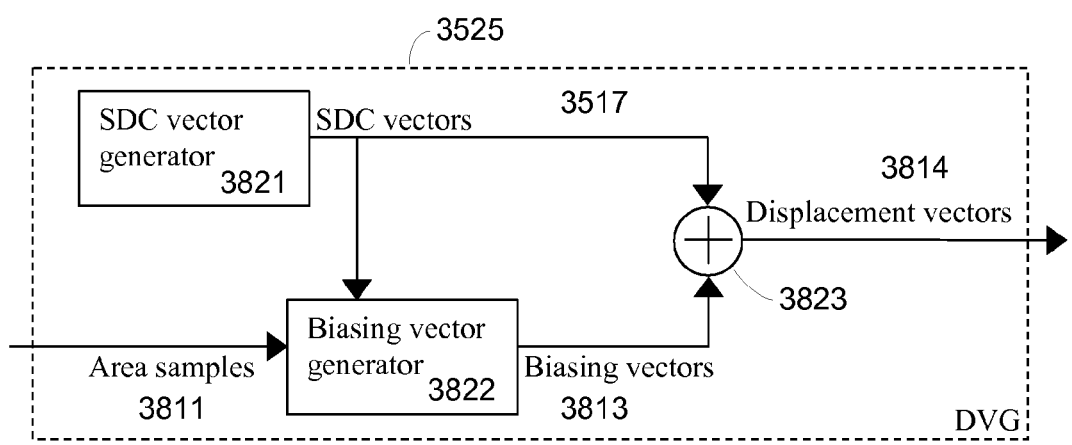
FIG. 38 is a high level block diagram of a displacement vector generator.

The Displacement Vector Generator (DVG) 3525 calculates stamp distortion compensation vectors (SDC vectors) 3517 and sample point displacement vectors to be used in Corner Enhancement Superposition (CES) and Intensity Surface Regenerator (ISR), as depicted in FIG. 38. A sparsely sampled SDC map is stored in internal RAM and expanded using bilinear interpolation.

$$f(a,b) = \text{floor}\left(\frac{V[n,m] + \left(a+\frac{1}{2}\right)\left(8-b-\frac{1}{2}\right)*V[n+1,m]}{8^2} + \frac{\left(8-a-\frac{1}{2}\right)\left(b+\frac{1}{2}\right)V[n,m+1] + \left(a+\frac{1}{2}\right)\left(b+\frac{1}{2}\right)V[n+1,m+1]}{8^2} + \frac{1}{2}\right)$$

Figure 39:
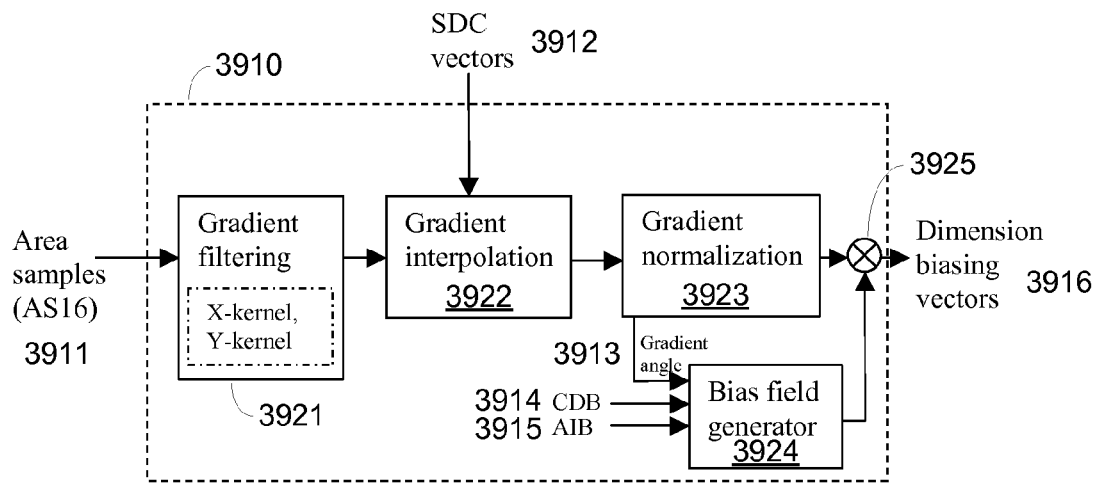
FIG. 39 provides additional detail of the biasing vector generator in FIG. 38.

As illustrated in FIG. 39, a gradient field is calculated by applying Prewitt filters 3921. Interpolation 3922 at the grid position pointed out by the SDC vector 3912—with bilinear interpolation. The CORDIC algorithm is implemented in ROM for normalization 3923 and angle measurement 3913.

The Image Resampler is a two dimensional interpolator, described extensively above, designed for low error interpolation for Manhattan oriented patterns. The two dimensional interpolator is decomposed in a sequence of 1-D (scanline) interpolations. A large neighborhood is provided to the Image Resampler in order to be able to reconstruct any sample point within the range of the Bias Displacement Vectors.

The code record decoder CRD decodes code words generated by CRE into 29-bit words each containing an existing corner together with the corresponding MacroPixel Number. This means that lines transferred from the Corner Record Decoder will only contain existing corners. Data is transferred at a rate of one 29-bit word every third clock cycle.

Alternative Block Diagram

Figure 40:
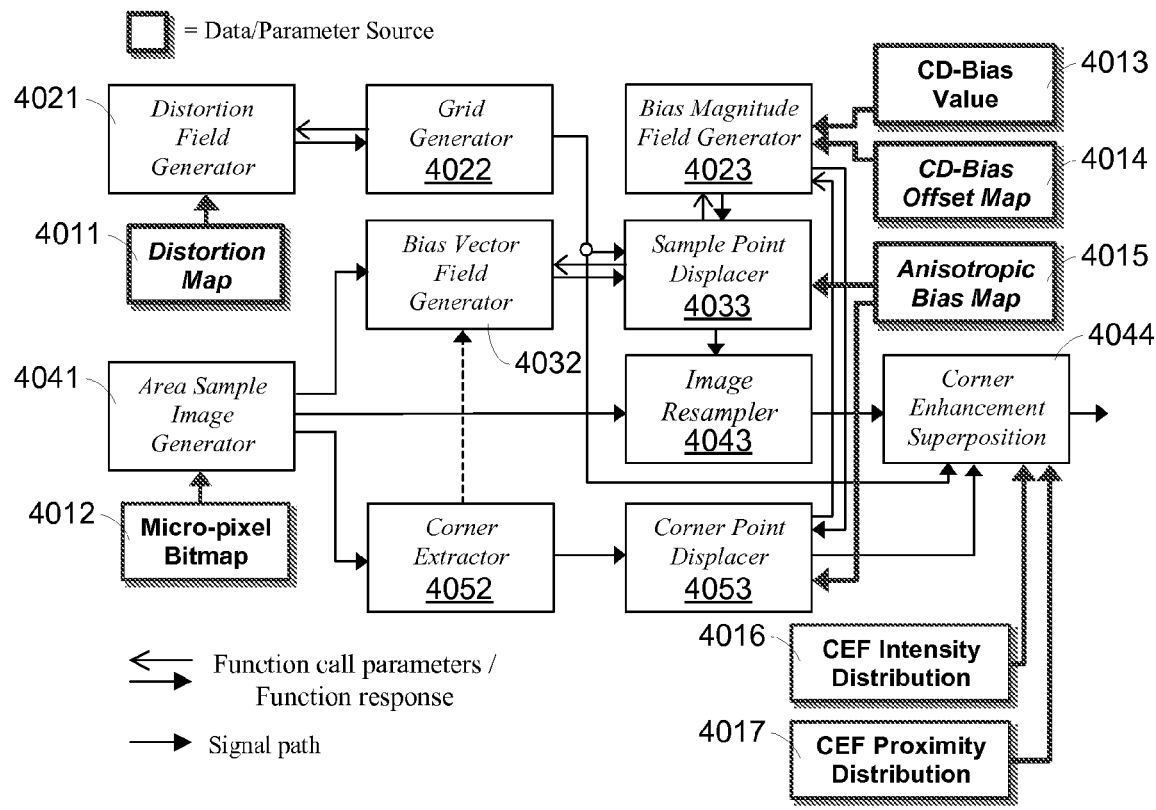
FIGS. 40-41 present an alternative block diagram, without reference to FPGA real estate.
Figure 41:
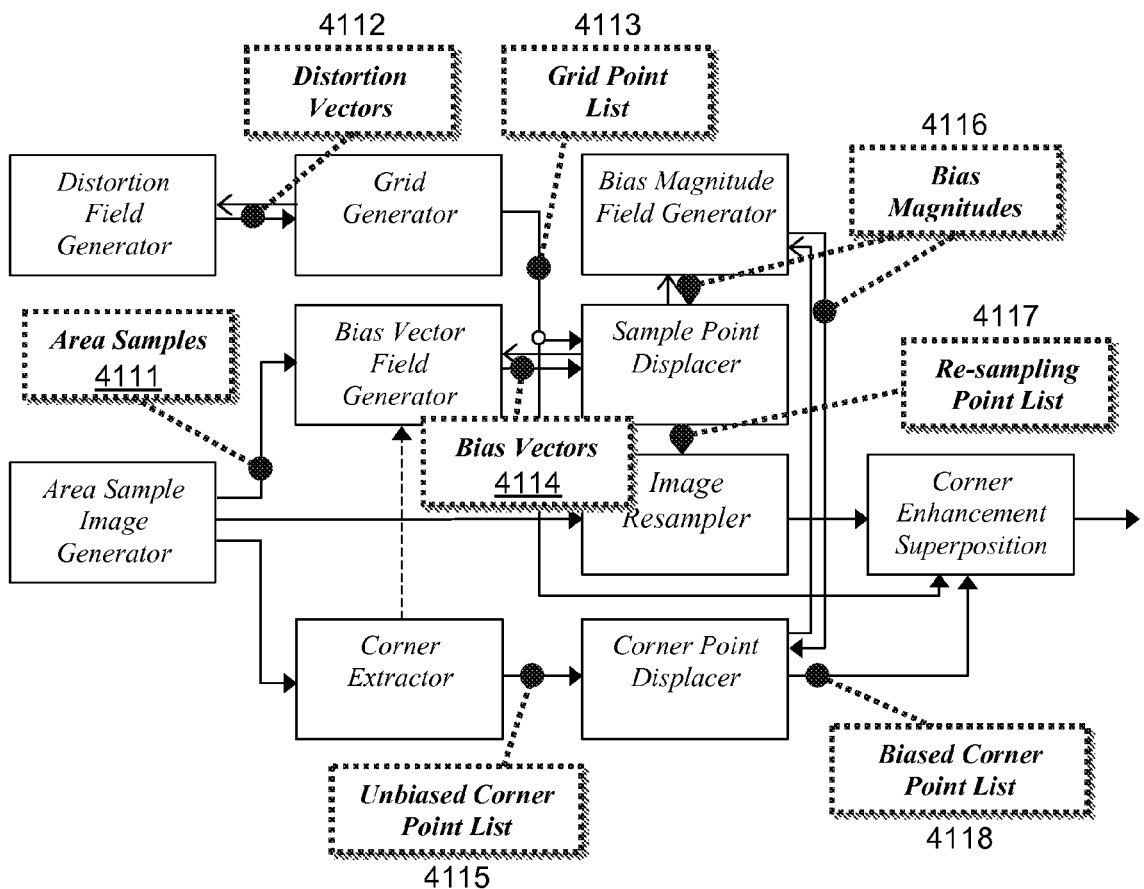

FIGS. 40-41 present an alternative block diagram, without reference to FPGA real estate. The operative blocks are the same in both figures. FIG. 40 adds data and parameter sources to the operative blocks. FIG. 41 identifies data flows among the operative blocks.

Input Data Structure Descriptions

Micro-Pixel Bitmap 4012

A binary sub-pixel bitmap generated by the rendering process. The bitmap can be super-sampled to create estimates of area samples of various sizes. The Micro-pixel bitmap is supplied by the Rendering Process on an element-by-element basis, and the variance is defined by the generating subsystem.

CD-Bias Value 4013

Represents a spatially and temporally invariant value (cdb) representing the isotropic dimension bias (CD-bias) for all regions of a specific mask-part section. The CD-Bias Value is supplied as a parameter in the WRI interface. It is temporally and spatially invariant over an extent of a Mask Part Section.

CD-Bias Offset Map 4014

Defines a temporally and spatially slowly varying scalar field, representing a shift in the magnitude of the isotropic dimension biasing (CD-Bias) for each region of the mask-part. The CD-Bias Offset Map consists of samples each defining a mask-part coordinates (cx,cy) and a scalar magnitude offset (dcdb), with a range of both negative and positive values. The sample coordinates to equidistant, Cartesian grids, coinciding with the centers of the SLM Stamps. The CD-Bias Map sample coordinates hence are implicitly given by the stamp coordinates.

The CD-Bias Offset Map is supplied as distributed and spatially correlated supplementary sections of the Pattern Geometry Data Stream in a way similar to the ones used by the Energy Spread function. It is supplied on an element-by-element basis, and the variance is defined by the generating sub-system.

Anisotropic Bias Map 4015

Represents a spatially and temporally invariant Bias Magnitude offset that is dependent on pattern edge orientation, representing the anisotropic dimension bias for all regions of the mask-part section. The Anisotropic Bias Map is supplied as a section of the AP parameter file. It is temporally and spatially invariant over a mask part section.

Distortion Map 4011

Represents a slowly varying vector field representing the image ray displacement at each point in the image field. The Distortion Map is populated with sparse samples of this field, with 150 samples per 100×100 modulator pixels or less. The distortion map elements each define mask-part coordinate (cx,cy) and a two component distortion vector (dx, dy). The Distortion Map sample coordinates are constrained to equidistant, Cartesian grids. The coordinates are defined by an equidistant grid whose offset and pitch is an implicit or explicit part of the input data structure. It is supplied in a parameter file.

CEF Distribution 4016

Represents the pseudo-features that are superimposed at corner locations to enhance corner dimensions. The CEF distribution is spatially and temporally invariant.

CEF Proximity Parameterization 4017

The CEF function has a proximity handling parameter set that may contain one or more input data structures quantifying proximity down-weighting. This parameter set will be temporally and spatially invariant over a mask part section.

Input Data Structure Supply and Variation

The framework does not per se specify a certain way of supplying parameters, but since conditions under which input data structures varies are important for both the understanding of usage capabilities as well as for the implementation, the input data structure supply mechanisms and its grounds are defined here.

Block Descriptions

Area Sample Image Generator 4041

Generates a map of equidistant Area Samples, overlapping or abutting depending on use. The sample Area size may also vary. The Area samples are derived from a Micro-pixel resolution Bitmap, supplied by the Rendering Process.

When square area samples are used, it is easy to combine smaller area samples into larger, and hence one mechanism could serve a plurality of outputs, which is indicated by the multiple output paths. Different area sample sizes are used for different purposes, depending on whether a high or low degree of pre-filtering and a high or low degree of resolution is desired. The choice of area sample sizes are not finally determined, but the below statements can be regarded as guidelines.

The Corner Extractor uses a high-resolution area sample map to be able to distinguish corners with high granularity. The samples are abutting and with four or eight times the spatial resolution of the modulator pixels.

The Image Resampler uses overlapping Area Samples with the size of the modulator pixels and twice the pitch of the modulator pixels.

The Bias Vector Field Generator uses large, overlapping area samples, with twice the size of the modulator pixel. This creates and extension of the vector field necessary to move samples outside objects towards the inside, and also provides a smoothing of the Bias Vector when the input pattern is complex.

Grid Generator 4022

Uses the vector samples generated by the Distortion Field Generator to generate a list of Grid Points, each point being displaced in accordance to a field created by interpolation of the Distortion Vector samples.

Bias Vector Field Generator 4032

Uses the Area Sample Image to derive a gradient field, which is sampled in the Grid Points generated by the Grid Generator. The Bias Vector Field may have an alternate layout in proximity to corners, for which reason corner representations may be supplied to the Bias Vector Field Generator. The output of the Bias Vector Field Generator is a list of Bias Vectors, one for each Grid Point.

Sample Point Displacer 4033

Generates a Resampling Point List with one sample point per Grid Point. Each Re-sampling Point is displaced in accordance to the orientation of Bias Vectors and the magnitude of the Bias (Derived from the CD-Bias and the Anisotropic Bias Map). The Bias Vectors are requested for each Grid Points by calling the Bias Vector Generator with the Grid Point coordinates. The Bias Values are requested for each Grid Point by calling the Bias Magnitude Field Generator with the Grid Point coordinates.

Corner Extractor 4052

Uses an Area Sample Image (with relatively dense sampling) to detect corners, with position, opening angle and orientation of the bisector.

Corner Point Displacer 4053

Generates a Displaced Corner Point List outgoing from the Unbiased Corner Point List extracted by the Corner Extractor.

The Corner Points are displaced to reflect the isotropic and anisotropic Dimension Bias. The displacement is dependent on both the Bias Magnitude Field and Anisotropic Bias Map. The function uses the Bias Magnitude and Anisotropic Bias together with the orientation of the Corner Points to calculate a new corner positions for the elements of the Biased Corner Point List. The Corner Points are not displaced with respect to Distortion Field; instead the pre-distorted Grid Point List is related to the Corner Points in the Corner Enhancement Superposition process. This eliminates the need to sample the Distortion Field at the positions of the corners.

Image Resampler 4043

Uses groups of 4-by-4 equidistant Area Samples to calculate a new Area Samples using the Re-sampling Point List generated by the Sample Point Displacer.

Bias Magnitude Field Generator 4023

Generates a Bias Magnitude (scalar) outgoing from a CD-Bias Value, and a CD-Bias Offset Map. The generator is activated by requests from the Resampling Displacer and the Corner Point Displacer Distortion Field Generator 4021

Generates a Distortion Vector outgoing from the Distortion Map. Each Distortion Vector Sample represents the Distortion Displacement in a particular nominal modulator pixel center point.

Corner Enhancement Superposition 4044

Adds a Corner Enhancement contribution value to the re-sampled Area Sample using the elements of the Biased Corner Point List as centers of the Corner Enhancement Distributions and the displaced grid points of the Grid Point List as sample positions for the Corner Enhancement Distributions. The corner enhancement function uses two distribution sets, an Intensity Distribution and a Proximity Field Distribution. A more detailed description if the process is given in a separate section of this document.

Data Structures

Grid Point List 4113

A list of Grid Points, one per generated modulator pixel, defining the position at which to sample the Bias Vector Field which is also the position at which the resulting Bias Vector is positioned to form the Re-sampling point. Each Grid Point is defined by coordinates [x,y].

Bias Vectors 4114

A list of vectors, one for each modulator pixel. Each vector defines the direction in which the corresponding Re-sampling point should be shifted to generate the sizing effect. Each point is defined by coordinates [x,y] and two vector components [dx,dy].

Bias Magnitudes 4116

Both the Sample Point Displacer and the Corner Point Displacer request Bias Magnitude estimates based on the coordinates for the sample points and the corner points respectively. The Bias Magnitude represents the nominal edge displacement of the isotropic dimension bias function.

Re-Sampling Point List 4117

A list of Re-sampling Points, one per generated modulator pixel, defining at what position the reconstruction of the everywhere defined area sample should be performed. Each point is defined by coordinates [x,y].

Area Sample Image 4111

A list of samples, several per generated modulator pixel, defining the area sample at a specific point. Each Area Sample is defined by coordinates [x,y] and an area sample value [as]. The Area Samples may be of different size and pitch, depending on the intended use.

Unbiased Corner Point List 4115

A list of corner points defining, for each corner, the orientation angle [orientation] of the bisector, the opening angle [opening], the coordinate [cx, cy] and optionally a figure-of-merit [f.o.m.]. This is the list as report from the Corner Extraction process, prior to the Dimension Bias manipulations applied in the Corner Displacement process.

Biased Corner Point List 4118

A list of corner points containing the same members as the Unbiased Corner Point List, but with each member displaced to reflect on the Isotropic and Anisotropic Dimension Bias.

Use Cases with Different Functionalities Engaged

This section show different functions of the architecture engaged one at a time. This is intended to create an understanding of the role of each sub-function (Grid Generator, Image Re-sampler, etc.) in the context of higher abstraction level system functions (Distortion Compensation, Dimension Bias, etc. The terminology of FIGS. 40-41 is followed.

Case 1—No Regional Image Displacement

In this case the area sample image is propagated directly to the output. Most of the blocks are operating in a passive, feed-through mode.

Operation Description

The Area Sample Image Generator generates modulator pixel sized area samples of an equidistant grid with pitch of half a modulator pixel. The Area Samples are overlapping.

The Distortion Field Generator generates a constant, zero-worth vector field.

The Grid Generator generates a Grid Point List with equidistant grid positions with a pitch of 1 modulator pixel.

The Bias Vector Field Generator is not engaged, nor is the Bias Magnitude Field Generator The Sample Displacer propagates the Grid Point List from the grid generator without any alterations and generates and identical Re-sampling Point List.

The Image Resampler uses the Resampling Point List from the Sample Point Displacer to generate data. The Resampling Point List exactly coincides with the grid positions used for Area Sample Image Generation. Hence the Resampling in this case is just the process of choosing the matching samples. The overlapping samples whose center does not coincide with the Resampling Point List are ignored.

Manipulation Result Description

The Sampling Points used for the Resampling exactly match the Sampling Points used for rendering. The Resampling image Reconstructor yields values that exactly matches the original Area Sample values.

Case 2—Distortion Compensation Only

In this case, the Grid Generator generates a list of Grid Point positions derived from a distortion vector sampled at the centers of the modulator pixels. The Sample Point Displacer as well as the Corner Enhancement superposition is completely transparent.

Operation Description

Modulator pixel sized area samples of an equidistant grid with pitch of a half a modulator pixel. The Area Samples are overlapping. These are used by the Image Resampler.

The Distortion Field generator generates a spatially slowly varying vector field.

The Grid generator generates a Grid Point List with grid positions deviating from the equidistant grid of Case (1) in accordance to the Distortion Field The Bias Vector Field Generator is not engaged, nor is the Bias Magnitude Field Generator The Sample Displacer propagates the Grid Point List from the grid generator without any alterations and generates an identical Re-sampling point list.

The Image Resampler uses the Resampling Point List from the Sample Point Displacer to generate data. The Resampling Points lie between the grid-positions used for Area Sample Image Generation. The Image Resampler uses interpolation to generate area sample values for the points of the Resampling Point List.

Manipulation Result Description

New Resampling Points are calculated outgoing from the original positions using the Distortion Vectors sampled in the locations of the original samples. The new Re-sampling Points are simply derived by adding the distortion vectors to the original grid point coordinates. The number of Resampling Points does not change.

Case 3—Dimension Bias Only

In this case, the Grid Generator is generating sample grid positions on a fixed grid. This grid is manipulated by shifting each grid position in accordance to a Bias Vector and a Bias Magnitude sampled at the modulator pixel centers. The Corner Enhancement superposition is completely transparent.

Operation Description

The Area Sample Image Generator generates two streams of area samples, one for the Image Resampler and one for the Bias Vector Field generator.

The Distortion Field Generator generates a zero vector field.

The Grid generator generates a Grid Point List with equidistant grid positions equaling the modulator pixel centre points.

The Bias Vector Field Generator generates a Bias Vector for each point in the Grid Point List.

The Bias Magnitude Field Generator provides a Bias Magnitude to the Sample Displacer.

The Sample Point Displacer alters the Grid Points with a direction derived from the Bias Vectors multiplied with the Bias magnitude.

The Image Resampler uses the Resampling Point List from the Sample Point Displacer to generate data. The Resampling Points does usually not coincide with the grid positions used for Area Sample Image Generation; instead new previously not explicit samples are derived using interpolation.

Manipulation Result Description

New Resampling points are calculated outgoing from Bias Vectors, Bias Magnitude and the Anisotropic Bias function. The Bias Vectors are derived from a Bias Vector field generated from the Area Sample image and represents a direction movement of a Resampling Point corresponding to the equivalence of a Dimension Bias. The Bias Magnitude is derived from the Bias Magnitude Field, and represents the distance with which to move the Resampling Point corresponding to the equivalence of a Dimension Bias.

The resulting re-sampled image pixel set will, when projected with an equidistant grid, represent altered dimensions of the individual features.

Case 4—Distortion Compensation and Dimension Bias in Combination

When Distortion Compensation and Dimension Bias are combined, the Grid Point List generated by the Sample Point Displacer is generated by concatenating two vector contributions: The Distortion Vectors, sampled at the modulator pixel centers, and the Bias Vectors, sampled at the displaced grid points reported by the Grid Generator.

Operation Description

The Area Sample Image Generator generates two streams of area samples, one for the Image Resampler and one for the Bias Vector Field generator.

The Distortion Field generator generates a spatially slowly varying vector field.

The Grid Generator generates a Grid Point List with grid positions deviating from the equidistant grid of Case (1) in accordance to the Distortion Field The Bias Vector Field Generator generates a Bias Vector for each point in the Grid Point List.

The Bias Magnitude Field Generator provides a Bias Magnitude to the Sample Displacer.

The Sample Point Displacer alters the pre-distorted Grid Points with a direction derived from the Bias Vectors multiplied with the Bias magnitude.

The Image Resampler uses the Resampling Point List from the Sample Point Displacer to generate data. The Resampling Points does usually not coincide with the grid positions used for Area Sample Image Generation; instead new previously not explicit samples are derived using interpolation.

Manipulation Result Description

New Resampling Points are calculated outgoing from the original positions using a concatenation of the Distortion Vectors sampled and a Displacement Vector derived from the Bias Vector Field, the Bias Magnitude Field and the Anisotropic Bias function.

Case 5—Corner Enhancement Only

Is this case, the Grid Generator generates sample point positions on a fixed grid. The Bias Vector Field is not used and the Sample Point Displacer is completely transparent. The Corner Extractor and the Corner Enhancement Superposition are active, introducing pseudo-feature contribution at and near corners detected in the Area Sample Image.

Operation Description

The Area Sample Image Generator generates two streams of area samples, one for the Image Resampler and one for the Corner Extractor.

The Distortion Field Generator generates a zero vector field.

The Grid generator generates a Grid Point List with equidistant grid positions equaling the modulator pixel centre points.

The Image Resampler uses the Resampling Point List from the Sample Point Displacer to generate data. The Resampling Point List exactly coincides with the grid positions used for Area Sample Image Generation. Hence the Resampling in this case is just the process of choosing the matching samples. The overlapping samples whose center does not coincide with the Resampling Point List are discarded.

The Corner Extractor identifies and reports a list of corners.

The Corner Displacer propagates the corner list without any alterations.

The Corner Enhancement superposition performs addition and/or blending of a corner enhancement pseudo-feature distribution sample over the result of the Image Resampler. The superposition process includes proximity down-weighting based on pattern distances.

Manipulation Result Description

At each nominal and equidistant Grid Point (in this case coinciding with the Resampling Points) residing near one or more corners, a CEF contribution distribution is superimposed or blended with the resulting values of the Image Resampling.

Case 6—Corner Enhancement and Dimension Biasing in Combination

In this case, the Grid Generator generates sample point positions on a fixed grid. This grid is manipulated by shifting each grid position in accordance to a Bias Vector and a Bias Magnitude sampled at the modulator pixel centers.

The Corner Extractor and the Corner Enhancement Superposition are active, introducing pseudo-feature contribution at and near corners detected in the Area Sample Image. The Corner Point positions are modified according to the extracted Corner Attributes and a Bias Magnitude sampled at the corner positions.

Operation Description

The Area Sample Image Generator generates three streams of area samples, one for the Image Resampler, one for the Bias Vector Field Generator and one for the Corner Extractor.

The Distortion Field Generator generates a zero vector field.

The Grid generator generates a Grid Point List with equidistant grid positions equaling the modulator pixel centre points.

The Bias Vector Field Generator generates a Bias Vector for each point in the Grid Point List.

The Bias Magnitude Field Generator provides a Bias Magnitude to the Sample Displacer.

The Sample Point Displacer alters the Grid Points with a direction derived from the Bias Vectors multiplied with the Bias magnitude.

The Image Resampler uses the Resampling Point List from the Sample Point Displacer to generate data. The Resampling Points does usually not coincide with the grid positions used for Area Sample Image Generation; instead new previously not explicit samples are derived using interpolation.

The Corner Extractor identifies and reports a list of corners.

The Corner Displacer alters the position of each Corner in accordance with the Bias Magnitude, the Anisotropic Bias function, the Corner Orientation and the Corner Opening Angle.

The Corner Enhancement superposition performs addition and/or blending of a corner enhancement pseudo-feature distribution sample over the result of the Image Resampler. The superposition process includes proximity down-weighting based on pattern distances.

Manipulation Result Description

New Resampling points are calculated outgoing from Bias Vectors, Bias Magnitude and the Anisotropic Bias function.

At each nominal and equidistant Grid Point residing near one or more corners, a CEF contribution distribution is superimposed or blended with the resulting values of the Image Resampling.

The center-points of the CEF distributions are displaced relative to the nominal Grid Points according to the Bias Magnitude, the Corner Orientation and Corner Opening Angle and the Anisotropic Bias function.

Case 7—Corner Enhancement and Distortion Compensation in Combination

In this case, the Grid generator generates a list of Grid Point positions derived from a distortion vector sampled at the centers of the modulator pixels. The Bias Vector Field is not used and the Sample Point Displacer is completely transparent.

The Corner Extractor and the Corner Enhancement Superposition are active, introducing pseudo-feature contribution at and near corners detected in the Area Sample Image. The Corner Enhancement superposition uses the difference vector between the pre-distorted Grid Positions reported by the Grid Generator and the Corner Point Positions to calculate the Corner Enhancement contribution.

Operation Description

The Area Sample Image Generator generates two streams of area samples, one for the Image Resampler and one for the Corner Extractor.

The Distortion Field generator generates a spatially slowly varying vector field.

The Grid generator generates a Grid Point List with grid positions deviating from the equidistant grid of Case (1) in accordance to the Distortion Field The Bias Vector Field Generator is not engaged, nor is the Bias Magnitude Field Generator The Sample Displacer propagates the Grid Point List from the grid generator without any alterations and generates and identical Re-sampling Point List.

The Image Resampler uses the Resampling Point List from the Sample Point Displacer to generate data. The Resampling Points lie between the grid-positions used for Area Sample Image Generation. The Image Resampler uses interpolation to generate area sample values for the points of the Resampling Point List.

The Corner Extractor identifies and reports a list of corners.

The Corner Displacer propagates the corner list without any alterations.

The Corner Enhancement superposition performs addition and/or blending of a corner enhancement pseudo-feature distribution sample over the result of the Image Resampler. The superposition process includes proximity down-weighting based on corner distances.

Manipulation Result Description

New Resampling Points are calculated outgoing from the original positions using the Distortion Vectors sampled in the locations of the original samples.

At each Displaced Grid Point (in this case coinciding with the Resampling Points) residing near one or more corners, a CEF distribution contribution is superimposed or blended with the resulting values of the Image Resampling.

Case 8—All Manipulations in Combination

In this case, the Grid generator generates a list of Grid Point positions derived from a distortion vector sampled at the centers of the modulator pixels. This grid is manipulated by shifting each grid position in accordance to a Bias Vector and a Bias Magnitude sampled at the modulator pixel centers.

The Corner Extractor and the Corner Enhancement Superposition are active, introducing pseudo-feature contribution at and near corners detected in the Area Sample Image. The Corner Point positions are modified according to the extracted Corner Attributes and a Bias Magnitude sampled at the corner positions. The Corner Enhancement superposition uses the difference vector between the pre-distorted Grid Positions reported by the Grid Generator and the Corner Point Positions to calculate the Corner Enhancement contribution.

Alternative Operating Environments

The resampling procedures described above have been described in the context of an SLM micromirror system. However, they have broader applications, some of which are described in this section.

An additional type of distortion due to irregular pixel-to-pixel placement. This can be a real displacement based on the placement of the pixels, such as nanotubes arrayed imperfectly, for instance, in a brush like structure. Pixel placement and beam distortion issues also may arise in single and multiple-beam optical pattern generators such as using scanning by a rotating polygon, an acousooptic device, a holographic device galvanometer or micromechanical scanner; single- or multi-beam electron-beam writers with a single column or multiple columns (ref. Philip Chang; ETEC; Broody; Canon; Mapper), raster-based ion-beam writers, writers based on near-field optics (tip arrays, hole arrays), micro-lens or zone-plate arrays (ref: Hank Smith, MIT), direct electrical exposure systems such as by AFM tips, "dip-pen", carbon-fiber or nanotube arrays (ref. Z. F. Ren, "GROWTH, CHARACTERIZATION, AND POTENTIAL APPLICATIONS OF PERIODIC CARBON NANOTUBE ARRAYS"; "ESS4810 Lecture Fall 2004" from Department of Engineering and System Science, National Tsing Hua University, 101, Section 2, Kuang Fu Road, HsinChu, Taiwan 300, ROC) or mechanical multipoint surface modification (IBM's "Millipede"). In addition to pixel-to-pixel placement errors these systems may need the other corrections or operations described in this application.

In other cases a pixel-to-pixel displacement may be a logical way of applying corrections to the writing system that is not afflicted with any real physical displacement of the pixels. The corrections are then purely empirical based on a calibration procedure and a model that shows that writing fidelity is better is a pixel is logically displaced. The datapath describe herein can be used with a wide variety of pattern generators, some of them with pixel-to-pixel displacements.

In either case, the rasterization is modified to represent a pixel grid with displaced pixels according to a pixel displacement data set. The displacement can be by single pixel, by rows, lines, stripes or blocks, or it can be by an interlaced sets of pixels corresponding to pixels from individual beams, polygon facets, exposure passes, or similar physical base for pixel to pixel displacements. More than one set can be applied to a single pixel or sample point, e.g. the correction can be the sum of the correction for a beam and the correction for a polygon facet.

Some Particular Embodiments

The present invention may be practiced as a method or device adapted to practice the method. The same method can be viewed from the perspective of modifying data on a datapath, preparing a mask in a mask writer using corrected data, or forming part of a semiconductor device either by direct writing or by using a mask, again using corrected data. The invention may be an article of manufacture, such as media impressed with logic to carry out computer-assisted resampling and correction of rasterized patterns.

One embodiment is a method of adjusting intensity values to be generated by a device including a multiplicity of micro elements. The intensity values correspond to a pattern represented in vector pattern data. The adjustments correspond to correction parameters to be applied to the pattern. This method includes rasterizing the vector pattern data to intensity values mapped to the micro elements. It further includes determining one or more resampling displacement vectors corresponding to the correction parameters. In real time, it includes resampling the rasterized intensity values at offset locations. The offset locations correspond to applying the resampling displacement vector as an offset. Also in real time, using the resampling intensity values to control the micro elements and project radiation onto a radiation-sensitive layer on a substrate.

A further aspect of this invention is expressing multiple correction parameters in a set of one or more resampling displacement vectors, prior to application of resampling. Chaining of corrections that can be applied by deriving a composite resampling displacement vector reduces the number times that the intensity values are modified between the rasterizing data to produce intensity values and the using resampling intensity values to control the micro elements. Potentially, all corrections can be combined into a single set of one or more resampling displacement vectors, including corrections for which the order of operations is important (e.g., corrections that re non-linear in the intensity value domain).

A sub combination of this embodiment may act upon rasterized pattern data in accordance with correction parameters, applying only the real-time method steps of resampling and using the resampling intensity values. This sub combination embodiment is a two-step method.

According to one aspect of either of these embodiments, the micro elements may be micro mirrors, for instance parts of a spatial light modulator having one or four million micro mirrors or, generally, millions of micro mirrors. Intensity values may be mapped one-to-one to micro mirrors or a whole number, greater than one, of intensity values may be mapped to an individual micromirror.

From other perspectives, the above embodiments may include pattern in at least a part of a device on the substrate in a direct writing process. Alternatively, they may include patterning a mask on the substrate and using the mask to produce at least part of a device on a semiconductor substrate in a lithographic process.

A variety of correction parameters may be used. One kind of correction parameters correct for distortion mapped across a field or image projected by the multiplicity of micro elements. For instance, these correction parameters map distortion across the face of an SLM. Another kind of correction parameters resize features present in the pattern while preserving the features' locations. Applying such parameters, three features might all grow (or shrink) while the distance between their centers of gravity is preserved. Resizing correction parameters may be isotropic or anisotropic.

In connection with resizing, real-time processing further may include locating feature corners in the rasterized intensity values and applying corner correction biases to corner-adjacent intensity values. The corner correction biases may correspond to a difference between results of resizing the features in the pattern in a vector domain and then rasterized them, as opposed to rasterizing the features and then resizing them in a raster domain.

Other correction parameters may include translation of position, or rotation or magnification of the pattern. Combinations of 2, 3 or more correction types may be applied along the same datapath, in real time.

Correction parameters may vary in space. For instance, when a mask is plasma hatched in a device having more on energy available at the center of the mask than the edges of the mask, correction parameters may increase feature sizes and the edges of the mask. Correction parameters also may vary in time. For instance, in a long and complicated mask writing process using a chemically accelerated resist, parts of the mask written at the end of the writing time may need a greater exposure than parts of the mask written at the beginning of the writing time.

In a further aspect of these embodiments, resampling further includes deriving a particular resampling intensity value using data from a neighborhood of at least four-by-four intensity values surrounding the particular resampling intensity value. Alternatively, resampling a particular resampling intensity value may further include processing at least data from a neighborhood of four-by-four intensity values surrounding the particular resampling intensity value, first processing one of rows or columns to derive intermediate resampling intensity values and then processing the intermediate resampling intensity values to produce the particular resampling intensity value. Any of the resampling procedures may include conditional selection of a particular calculation method from a plurality of methods to derive an intermediate resampling intensity value. The conditional selection would depend on intensity values in the row or column of the neighborhood from which the intermediate resampling intensity values are produced. The same conditional selection may be applied to a set of intermediate resampling intensity values and used to produce a particular resampled intensity value.

In this context, "real-time" implies as part of the datapath used to periodically reload the multiplicity of micro elements. In one environment to which the claimed methods may be applied, the micro elements are micro mirrors of an SLM and pattern variations are loaded into the SLM at least 1000 times per second. In a more advanced implementation, pattern variations are reloaded at least 4000 times per second.

Another embodiment is a method that correct distortions in a pattern generator using an SLM. This method includes mapping distortions related to at least one SLM and generating a correction map for the SLM according to the distortion map. The method further includes projecting a pattern from the SLM onto a substrate using the correction map to diminish distortion within the pattern projected onto the substrate. An aspect of this embodiment includes moving the center of gravity of at least one feature in the pattern by applying the correction map. An alternative aspect is resizing at least one feature in the pattern by applying the correction map, without moving its center of gravity. Preferably, the correction map is applied to rasterized data, but it could be applied to vector pattern data.

Various devices may practice the methods described above. One device is an apparatus that correct distortions in the pattern generator using an SLM, including logic and resources adapted to generate a mapping distortions related to at least one SLM and generate a correction map for the SLM corresponding to the distortion map, the correction map being adapted for use in projecting a pattern from the SLM onto a substrate. This apparatus may be part of a pattern generator which further includes an SLM coupled to the logic and resources and an optical path, optically coupling the SLM and the substrate. According to this variation of the embodiment, the map of distortions may correspond to a difference between a pattern received on the substrate and a pattern intended to be generated using the SLM.

Another device that practices the method described above is a semiconductor device produced using a mask written according to the methods described above. Yet another device is a semiconductor device produced by direct writing in accordance with the methods described above. A pattern generator may be adapted to practice the methods described above, particularly a pattern generator using an SLM and a flashing or strobe partially-coherent excimer laser source.

The methods described above may also be applied to controllers that generate a rasterized image by scanning a laser, electron or particle beam across the substrate.

While the present invention is disclosed by reference to the preferred embodiments and examples detailed above, it is understood that these examples are intended in an illustrative rather than in a limiting sense. Computer-assisted processing is implicated in the described embodiments. It is contemplated that modifications and combinations will readily occur to those skilled in the art, which modifications and combinations will be within the spirit of the invention and the scope of the following claims.

We claim as follows:

1. A method of adjusting intensity values to be generated by a device, the method including:
    rendering the vector pattern data using at least hardware to intensity values;
    determining one or more resampling displacement vectors, wherein a particular resampling displacement vector a vector sum of one or more resampling displacement sub-vectors corresponding to one or more correction parameters;
    resampling the rendered intensity values at offset locations determined from the resampling displacement vectors; and;
    forwarding the resampled intensity values towards a device that projects radiation onto a radiation sensitive surface.

2. The method of claim 1, wherein at least one of the correction parameters corresponds to at least one of the following correction actions:
    compensating for a distortion using a correction map;
    compensating for at least one pixel displacement;
    rotating the pattern;
    resizing a feature;
    translating the pattern's position;
    scaling a pattern; or
    applying corner correction biases to corner-adjacent intensity values.

3. The method of claim 1, wherein the intensity values are mapped to the illumination of microelements.

4. The method of claim 3, wherein the intensity values are mapped to the illumination of microelements in a spatial light modulator.

5. The method of claim 4, wherein the intensity values are mapped to individual micromirrors in a spatial light modulator.

6. The method of claim 1, wherein the correction parameters correct for distortion across a field projected by a multiplicity of microelements.

7. The method of claim 1, further including patterning at least part of a device on the substrate in a direct writing process.

8. The method of claim 1, wherein the radiation sensitive surface is a resist material over a substrate, further including generating a mask on the substrate and using the mask to produce at least part of a device in a lithographic process.

9. The method of claim 1, wherein the correction parameters include resizing features present in the pattern while essentially preserving the features' locations.

10. The method of claim 9, wherein the feature resizing correction parameters are anisotropic.

11. The method of claim 1, wherein the correction parameters include corner correction biases that correspond to a difference between results of resizing features in a vector domain and then rendering the features, as opposed to rendering the features and then resizing the features in a raster domain.

12. The method of claim 1, wherein a single resampling operation accomplishes multiple corrections.

13. The method of claim 1, wherein resampling further includes deriving a particular resampled intensity value using data from a neighborhood of at least 4 by 4 intensity values surrounding the particular resampled intensity value.

14. The method of claim 1, wherein said compensating for a pixel displacement is a logical way of applying corrections to a writing system that is not afflicted with any real physical displacement of the pixels.

15. The method of claim 1, wherein said compensating for a pixel displacement is empirical based on a calibration procedure and a model that shows that writing fidelity is better if a pixel is logically displaced.

16. The method of claim 1, wherein the rasterization is modified to represent a pixel grid with displaced pixels according to a pixel displacement data set.

17. The method of claim 1, wherein the pixel displacement is a pixel-to-pixel displacement.

18. The method of claim 1 wherein the pixel displacement is by at least one of single pixels, pixel rows, pixel lines, stripes or blocks.

19. The method of claim 1 wherein the pixel displacement for pixel-to-pixel displacement is by interlaced sets corresponding to pixels from individual beams, polygon facets, or exposure passes.

20. The method of claim 1, wherein the device generates a rendered image by scanning a laser, electron or particle beam across the substrate.

21. The method of claim 1, wherein the device generates a rendered image by applying a single or multi-beam optical pattern generator using a scanning by a rotating polygon, an acousto-optic device, a holographic device galvanometer or micromechanical scanner.

22. The method of claim 1, wherein the device generates a rendered image by applying a single- or multi-beam electron-beam writer with a single or multiple columns.

23. The method of claim 1, wherein the device generates a rendered image by applying a rendered ion-beam writer.

24. The method of claim 1, wherein the device generates a rendered image by applying a writer based on near-field optics.

25. The method of claim 1, wherein the device generates a rendered image by applying a writer based on micro-lens arrays.

26. The method of claim 1, wherein the device generates a rendered image by applying a writer based on zone-plate arrays.

27. The method of claim 1, wherein the device generates a rendered image by applying a direct electrical exposure system.

* * * * *